US012700860B1

(12) United States Patent
Agrawal et al.

(10) Patent No.: US 12,700,860 B1
(45) Date of Patent: Aug. 4, 2026

(54) VOLTAGE SCALABLE FAIL-SAFE IO DRIVERS

(71) Applicant: Synopsys, Inc., Sunnyvale, CA (US)

(72) Inventors: Ankit Agrawal, Greater Noida (IN);
Shailesh Kumar, Nodia (IN)

(73) Assignee: Synopsys, Inc., Sunnyvale, CA (US)

( * ) Notice: Subject to any disclaimer, the term of this patent is extended or adjusted under 35 U.S.C. 154(b) by 184 days.

(21) Appl. No.: 18/798,685

(22) Filed: Aug. 8, 2024

Related U.S. Application Data

(63) Continuation-in-part of application No. 18/106,897, filed on Feb. 7, 2023, now Pat. No. 12,085,970.

(51) Int. Cl.
| | |
|---|---|
| *H03K 17/082* | (2006.01) |
| *H03K 17/10* | (2006.01) |
| *H03K 19/0185* | (2006.01) |

(52) U.S. Cl.
CPC ....... *H03K 17/0822* (2013.01); *H03K 17/102* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 6,320,414 | B1 | 11/2001 | Annema et al. |
| 6,404,269 | B1 * | 6/2002 | Voldman .............. H10D 89/811 |
| | | | 327/537 |
| 6,493,658 | B1 | 12/2002 | Koford et al. |

| | | | |
|---|---|---|---|
| 6,628,149 | B2 * | 9/2003 | Ajit .................. H03K 19/00315 |
| | | | 327/333 |
| 7,605,611 | B2 * | 10/2009 | Bringivijayaraghavan ................ H03K 19/01721 |
| | | | 326/87 |
| 7,936,209 | B2 | 5/2011 | Bhattacharya et al. |
| 8,008,951 | B2 * | 8/2011 | Isik ...................... H03K 17/102 |
| | | | 327/108 |
| 9,793,892 | B2 | 10/2017 | Wu |
| 10,218,352 | B2 | 2/2019 | Fukuda |

(Continued)

OTHER PUBLICATIONS

Mentze, E.J. et al. "A scalable high-voltage output driver for low-voltage CMOS technologies," IEEE Transactions on Very Large-Scale Integration Systems, vol. 14, No. 12, Dec. 2006, pp. 1-7.

(Continued)

*Primary Examiner* — Thomas J. Hiltunen
(74) *Attorney, Agent, or Firm* — Fenwick & West LLP

(57) ABSTRACT

A voltage driver for supplying a supply voltage includes multiple PMOS transistors, multiple NMOS transistors, a pad, impedance divider circuits, NMOS clampers, PMOS clampers, a gate protection circuit, and a bulk protection circuit. A maximum of the supply voltage is N times a maximum of the drain-source voltage of each transistor. The pad is configured to receive a voltage signal for dynamically controlling gates of a subset of the NMOS transistors and a subset of the PMOS transistors. The impedance divider circuits are configured to generate voltage signals. The NMOS clampers and PMOS clampers are configured to receive reference voltages and limited voltage signals to generate output. The gate protection circuit are between outputs of the clampers and gates of the transistors. The bulk protection circuit is between bodies of the transistors and the impedance divider circuit.

20 Claims, 17 Drawing Sheets

(56)         References Cited

U.S. PATENT DOCUMENTS

| | | | |
|---|---|---|---|
| 10,511,304 | B2 | 12/2019 | Pan et al. |
| 10,749,511 | B2 * | 8/2020 | Geng ............... H03K 19/00315 |
| 11,258,435 | B2 | 2/2022 | Kim |
| 11,418,189 | B2 * | 8/2022 | Singrigowda .... H03K 19/00315 |
| 11,664,800 | B1 | 5/2023 | Akurathi et al. |
| 11,962,307 | B2 * | 4/2024 | Wang ........................ H03K 5/24 |
| 12,085,970 | B1 * | 9/2024 | Agrawal ................... G05F 1/56 |
| 2010/0271118 | A1 * | 10/2010 | Bhattacharya ............................... H03K 19/018528 327/543 |
| 2012/0200338 | A1 | 8/2012 | Olson |

OTHER PUBLICATIONS

United States Office Action, U.S. Appl. No. 18/106,897, filed Nov. 8, 2023, 15 pages.

* cited by examiner

200A
NMOS Clamper

200B
PMOS Clamper

1300

VOLTAGE SCALABLE FAIL-SAFE IO DRIVERS

CROSS REFERENCE TO RELATED APPLICATION

This application is a continuation-in-part of U.S. patent application Ser. No. 18/106,897, filed Feb. 7, 2023, which is incorporated in reference herein in its entirety.

TECHNICAL FIELD

The present disclosure relates to an input/output (IO) driver for supplying a voltage to devices, more specifically to a high voltage IO driver using devices with low voltage tolerance.

BACKGROUND

It is challenging to design a high-voltage supply IOs driver with lower voltage level tolerant devices. For example, the lower voltage level tolerant devices (such as a voltage between a gate terminal and a source terminal of a p-channel metal oxide semiconductor (PMOS) transistor or a n-channel metal oxide semiconductor (NMOS) transistor) have a voltage tolerance of vdd, and the high voltage supply IOs driver is to supply a voltage, denoted as vddio that is N times of vdd, i.e., vddio=N*vdd, where N>1.

Existing technologies use a cascoded driver architecture to design a high voltage supply IO driver with vddio=2*vdd. Gates of cascoded devices that are adjacent to a pad are dynamically controlled by sensing the voltage level at the pad. Such a cascoded driver architecture requires at least two analog reference voltages, namely vrefn=vdd, and vrefp=vddio-vdd, to overcome possible device stress issues, where vrefn and vrefp references are generated from interface supply vddio in reference generator block. The gates of the devices that are adjacent to the pad, e.g., a first PMOS transistors gate, are generated through a multiplexer between vrefp and the pad, while NMOS gate is generated through a multiplexer between vrefn and the pad However, such existing technologies are generally not capable of supplying a voltage higher than 2*VDD because designing the multiplexer circuits between the pad and vrefp, or a pad and vrefn becomes challenging when vddio>2*VDD. Further, using the same cascoded architecture and/or even with more stacking for higher vddio levels and/or increasing the number of analog references will not help to achieve the required protection for devices, while achieving rail-to-rail swing at the pad.

Further, in some cases, when the power supply voltage (VDD) is at zero while the IO pad voltage is not at zero, this situation could cause voltages within the circuit to exceed the tolerance of the circuit's components. Transistors and other semiconductor devices within the circuit are typically designed to handle voltages close to their supply voltage (VDD). If they encounter voltages much higher than their intended range (which might be the case if VDD is zero but the IO pad voltage is not), this can lead to breakdowns and permanent damage to the devices.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Designing high voltage supply IOs (supplying a voltage of vddio) with lower voltage level tolerant devices (having a voltage tolerance of vdd) often includes using cascoded driver architectures. The gates of cascoded devices, adjacent to a pad, are dynamically controlled by sensing the voltage level at the pad. This architecture requires two analog reference voltages, namely, vrefn=vdd, and vrefp=vddio-vdd, to overcome possible device stress issues. vrefn and vrefp references are generated from interface supply vddio in reference generator block.

For existing conventional vddio=2*vdd driver architecture, the gates of the devices adjacent to the pad, e.g., first PMOS transistors gate, is generated through a first multiplexer between vrefp and the pad, while NMOS gate is generated through a second multiplexer between vrefn and the pad. As the supply is increased to 3*vdd or higher, designing the multiplexer circuits between pad and vrefp and pad and vrefn is challenging because using the same architecture and/or even with more stacking for higher vddio levels and/or increasing the number of analog references will not help to achieve the required protection of devices, while achieving rail to rail swing at the pad.

The current application discloses novel architecture designs that solve the above-described problem and provide N*vdd IO driver (N>2) using vdd level tolerant devices and only two internal references for device stress protection without any electrical over-stress issues or aging issues. In particular, the architectures disclosed herein can be widely used across all possible interface IOs that interface with N*vdd or higher supplied board environment, including general purpose input/output (GPIO), 12C GPIO, 13C GPIO, secure digital input/output (SDIO), serial peripheral interface (SPI), bus interfaces, etc. Additionally, the architectures disclosed herein provide the benefits of reduced electrical over-stress issues or aging issues.

A topology used in the architecture includes dynamically defining gates of PMOS transistors and NMOS transistors that are adjacent to the pad (except top two PMOS transistors and bottom two NMOS transistors) to avoid overstress issues while achieving rail-to-rail swing at the pad. Intermediate nets with voltage swings are generated (e.g., padn2by3 and padp1by3 for the 3*vdd case) from the impedance divider circuit between vddio supply to pad and between pad to ground. These nets are then fed as input to the clamper. Outputs of the clamper are used as input for the successive clampers being used and clamper outputs are fed as input to the driver gates. This topology is completely scalable thus can be enhanced for any high-voltage solution.

Figure 1:
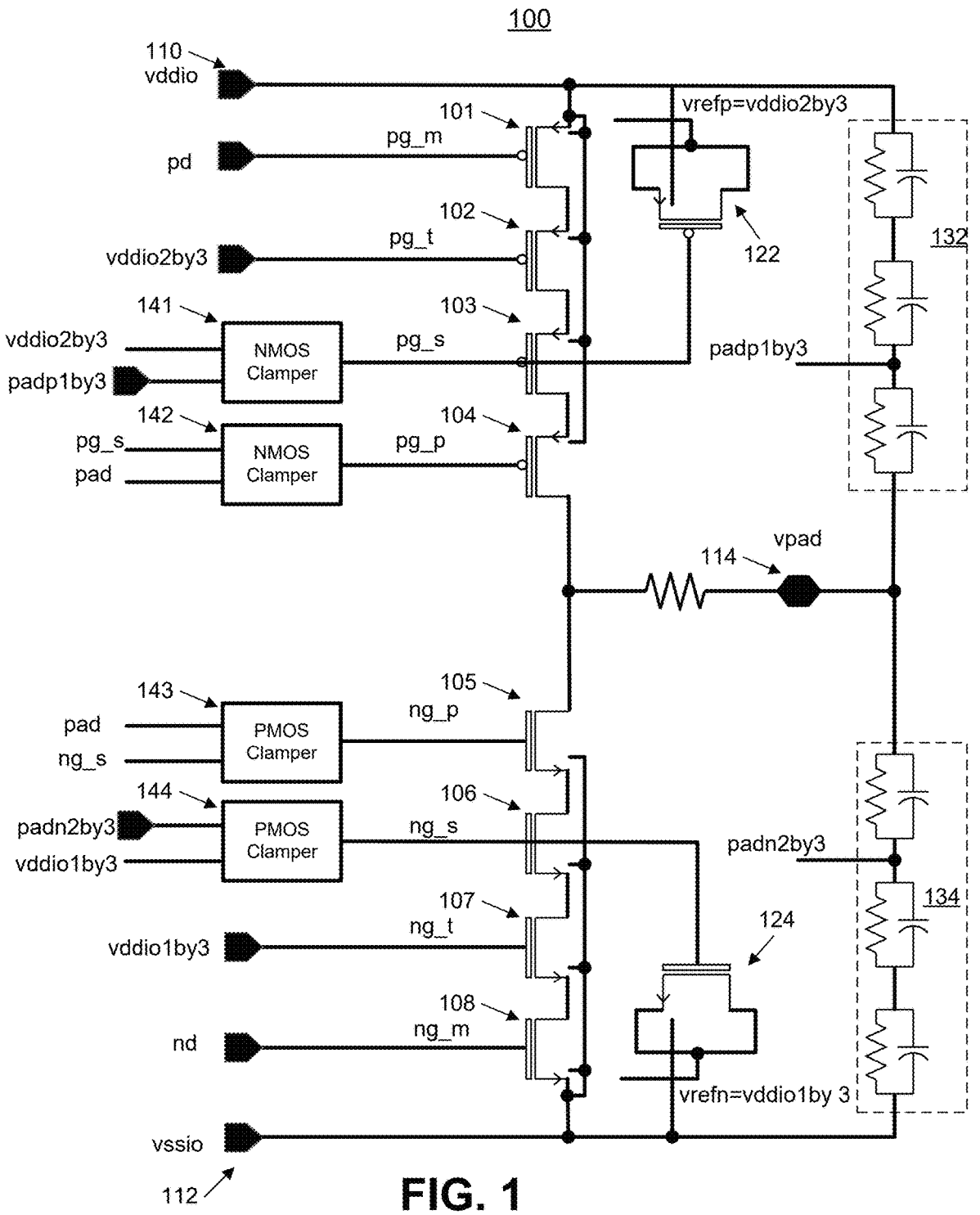
FIG. 1 illustrates an example architecture of a 3*vdd IO driver, in accordance with some embodiments.

FIG. 1 illustrates an example architecture of a N*vdd driver 100, where N is a natural number and in this example N=3. The voltage driver 100 includes four PMOS transistors 101-104 and four NMOS transistors 105-108 that are connected to each other in series. Each of the PMOS transistors 101-104 and NMOS transistors 105-108 includes a source terminal, a drain terminal, and a gate terminal. A voltage tolerance between the source terminal and the gate terminal of each of the transistors 101-108 is vdd. The supply voltage between terminals 110 and 112 is vddio–vssio, where vssio is ground. Terminal 110 is connected to the source terminal of PMOS transistor 101, and terminal 112 is connected to the source terminal of NMOS transistor 108.

The transistors 101-108 are also referred to as driver devices. In particular, PMOS transistor 101 is also referred to as PMOS main, PMOS transistor 102 is also referred to as PMOS tertiary, PMOS transistor 103 is also referred to as PMOS secondary, PMOS transistor 104 is also referred to as PMOS primary. Similarly, NMOS transistor 105 is also referred to as NMOS primary, NMOS transistor 106 is also referred to as NMOS secondary, NMOS transistor 107 is also referred to as NMOS tertiary, and NMOS transistor 108 is also referred to as NMOS main.

In some embodiments, the voltage driver 100 also includes two decoupling capacitor (also referred to as "decap") circuits 122, 124 that are connected to pg_s and ng_s to thereby suppress on-chip power supply noise thereon.

The voltage driver 100 also includes a pad 114, which is a terminal or pin configured to receive a voltage signal (referred to as vpad) for dynamically controlling gates of the PMOS transistors 103-104 and PMOS transistors 105-106. In some embodiments, pad may swing between 0 and vddio. When vdd=1.2, vddio=3.6, and pad=0 or 3.6.

The voltage driver 100 also includes two impedance divider circuits 132, 134. The first impedance divider circuit 132 is placed between terminal 110 and the pad 114 to generate a first voltage signal (referred to as padp1by3) that is a fraction of a voltage between pad and vddio (referred to as padp), where padp1by3=padp/3. The second impedance divider circuit 134 is placed between pad 114 and terminal 112 to generate a second voltage signal (referred to as padn2by3) that is a fraction of a voltage between pad and vssio, where padn2by3=2*padn/3. In some embodiments, each of the first or second impedance divider circuits 132, 134 includes N identical resistor-capacitor (RC) circuits, and the first and second voltage signal are generated by the RC circuits. For example, as illustrated, when N=3, there are three identical circuits in each of the first or second impedance divider circuit 132, 134.

The voltage driver 100 also includes two NMOS clampers 141, 142, and two PMOS clampers 143, 144. As illustrated, each of the clampers 141-144 receives two input signals and generates one output signal. In particular, NMOS clamper 141 receives vrefp (=vddio2by3) and padp1by3 as input to generate an output signal denoted as pg_s, which is in turn input into the gate terminal of PMOS transistor 103 and the NMOS clamper 142. NMOS clamper 142 receives pg_s (output by NMOS clamper 141) and pad to generate an output signal denoted as pg_p, which is in turn input into the gate terminal of PMOS transistor 104. Similarly, PMOS clamper 144 receives vrefn (=vddio1by3) and padn2by3 as input and generate an output signal denoted as ng_s, which is in turn input to the gate terminal of NMOS 106 and PMOS clamper 143. PMOS clamper 143 receives ng_s (output by PMOS clamper 144) and pad to generate an output signal denoted as ng_p, which is in turn input into the gate terminal NMOS transistor 105. As such, the gate terminals of PMOS transistors 103-104 and NMOS transistors 105-106 are controlled by the voltage vpad at pad.

Further, the gate terminal of PMOS transistor 101 is input a data signal denoted as pd; gate terminal of PMOS transistor 102 is input vrefp (=vddio2by3); gate terminal of NMOS transistor 108 is input a data signal denoted as nd, and gate terminal of NMOS transistor 107 is input vrefn (=vddio1by3). As such, the gate terminals of PMOS transistors 101-102 and NMOS transistors 107-108 are fixed and not controlled by vpad.

Figure 2A:
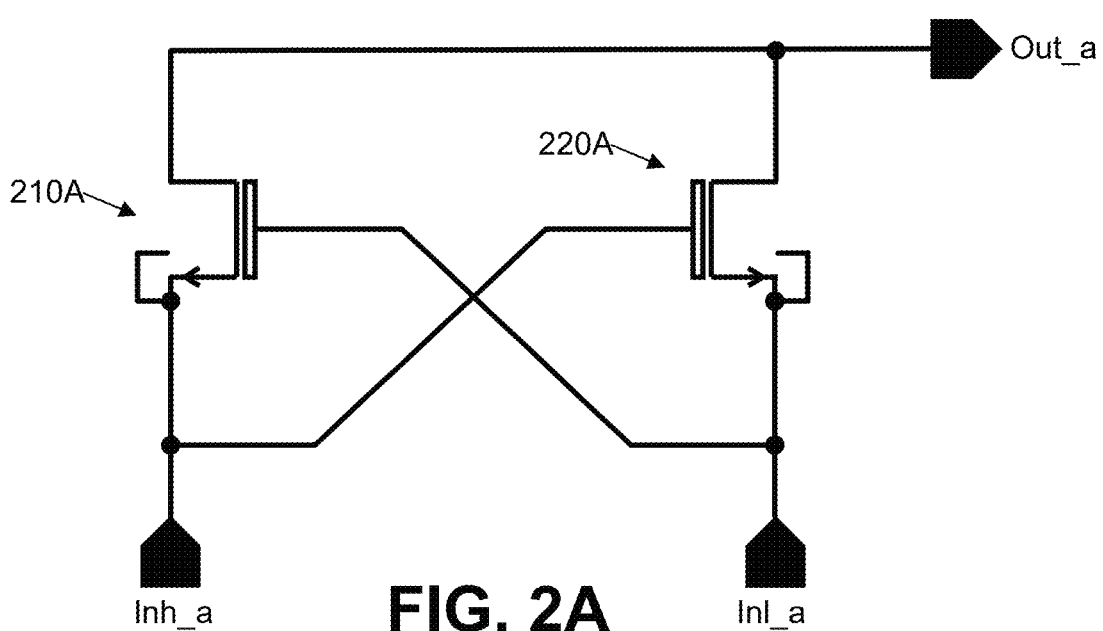
FIG. 2A illustrates an example architecture of an NMOS clamper, in accordance with some embodiments.
Figure 2B:
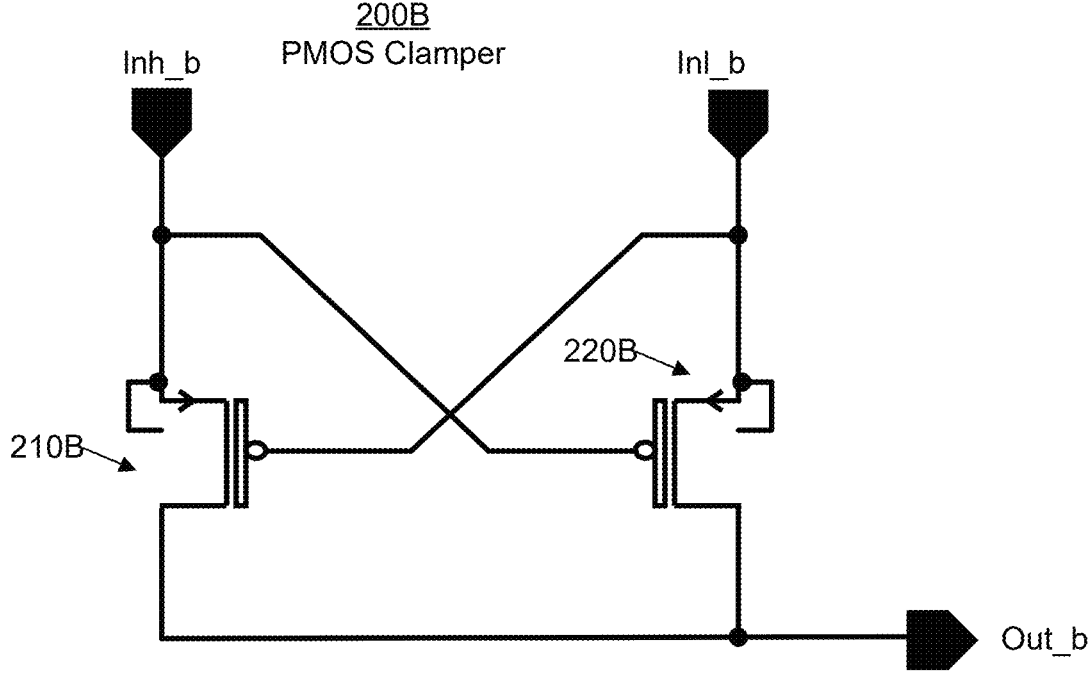
FIG. 2B illustrates an example architecture of a PMOS clamper, in accordance with some embodiments.

Additional details about NMOS clampers 141, 142 and PMOS clampers 143, 144 are further illustrated in FIGS. 2A and 2B. FIG. 2A illustrates an example of architecture of an NMOS clamper 200A, which corresponds to the NMOS clampers in the 3*vdd driver 100 of FIG. 1. The NMOS clamper includes two interconnected NMOS transistors 210A and 220A. The gate terminal of NMOS transistor 210A is connected to the source terminal of NMOS transistor 220A, and the gate terminal of NMOS transistor 220A is connected to the source terminal of NMOS transistor 210A. Drain terminals of the two NMOS transistors 210A and 220A are connected to form an output terminal. The source terminals of the two NMOS transistors 210A and 220A form two input terminals. The NMOS clamper 200A is configured to receive two voltage signals, denoted as inh and inl, to output a minimum of the two voltages, denoted as out_a=min(inl_a, inh_a)=inl_a, where inl_a<inh_a.

FIG. 2B illustrates an example architecture of a PMOS clamper 200B, which corresponds to the PMOS clampers in the 3*vdd driver 100 of FIG. 1. Similar to the NMOS clamper shown in FIG. 2A, the PMOS clamper includes two interconnected PMOS transistors 210B and 220B. The gate terminal of PMOS transistor 210B is connected to the source terminal of PMOS transistor 220B, and the gate terminal of PMOS transistor 220B is connected to the source terminal of NMOS transistor 210B. Drain terminals of the two PMOS transistors 210B and 220B are connected to form an output terminal. The source terminals of the two PMOS transistors 210B, 220B form two input terminals. The PMOS clamper 200B is configured to receive two voltage signals, denoted as inh and inl, to output a maximum of the two voltages, denoted as out_b=max(inl_b, inh_b)=inh_b, where inl_b<inh_b.

Example logic implemented in those clampers is shown in Table 1 below. As shown in Table 1,

TABLE 1

| Driver devices | | gate voltages of driver devices | when pad = 3.6 V | when pad = 0 V | Treatment of devices gates | Dynamic Mux Implementation |
|---|---|---|---|---|---|---|
| PMOS main (data) (PMOS transistor 101 of FIG. 1) | PM | pg_m | pd (data) | pd (data) | Fix | pd (data) |
| PMOS tertiary (PMOS transistor 102 of FIG. 1) | PT | pg_t | vddio2by3 | vddio2by3 | Fix | vddio2by3 |
| PMOS secondary (PMOS transistor 103 of FIG. 1) | PS | pg_s | vddio2by3 | vddio1by3 | Dynamic Mux | min[vddio2by3, padp1by3] |
| PMOS primary (PMOS transistor 104 of FIG. 1) | PP | pg_p | vddio2by3 | pad | Dynamic Mux | min[pad, pg_s] |
| NMOS primary (NMOS 105 of FIG. 1) | NP | ng_p | pad | vddio1by3 | Dynamic Mux | max[pad, ng_s] |
| NMOS secondary (NMOS 106 of FIG. 1) | NS | ng_s | vddio2by3 | vddio1by3 | Dynamic Mux | max[padn2by3, vddio1by3] |
| NMOS tertiary (NMOS 107 of FIG. 1) | NT | ng_t | vddio1by3 | vddio1by3 | Fix | vddio1by3 |
| NMOS main (data) (NMOS 108 of FIG. 1) | NM | ng_m | nd (data) | nd (data) | Fix | nd (data) |

Figure 3:
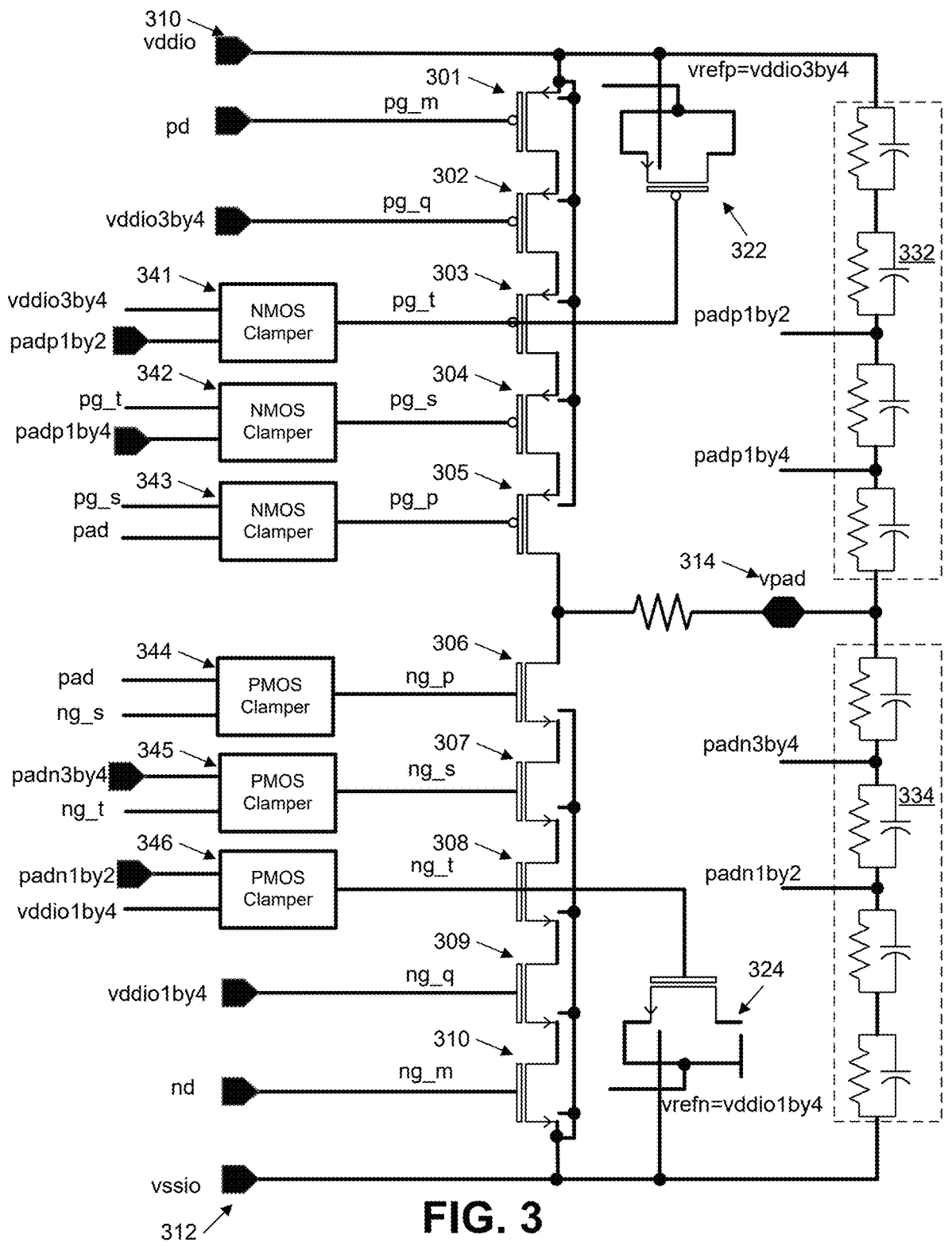
FIG. 3 illustrates an example architecture of a 4*vdd IO driver, in accordance with some embodiments.

A similar methodology can be further extended for 4*vdd. FIG. 3 illustrates an example architecture of a N*vdd driver 300, where N=4. Referring to FIG. 3, device (transistor) tolerance limit is vdd and supply is vddio=4*vdd. The voltage driver 300 includes N+1 (=5) PMOS transistors 301-305 and N+1 (=5) NMOS transistors 306-310 that are connected to each other in series. A voltage tolerance between the source terminal and the gate terminal of each of the transistors 101-108 is vdd. The supply voltage between terminals 310 and 312 is vddio−vssio=4*vdd, where vssio is ground. Terminal 310 is connected to the source terminal of PMOS transistor 301, and terminal 312 is connected to the source terminal of NMOS transistor 301.

Transistors 301-308 are also referred to as driver devices. In particular, PMOS transistor 301 is also referred to as PMOS main, PMOS transistor 302 is also referred to as PMOS quaternary, PMOS transistor 303 is also referred to as PMOS tertiary, PMOS transistor 304 is also referred to as PMOS secondary, and PMOS transistor 305 is also referred to as PMOS primary. Similarly, NMOS transistor 306 is also referred to as NMOS primary, NMOS transistor 307 is also referred to as NMOS secondary, NMOS transistor 308 is also referred to as NMOS tertiary, NMOS transistor 309 is also referred to as NMOS quarternary, and NMOS transistor 301 is also referred to as NMOS main.

In some embodiments, the voltage driver 300 also includes two decap circuits 322, 324 connected to pg_t and ng_t to thereby suppress on-chip power supply noise thereon.

The voltage driver 300 also includes a pad 314 configured to receive a voltage signal (referred to as pad) for dynamically controlling gates of the PMOS transistors 303-305 and PMOS transistors 306-308. In some embodiments, vpad may swing between 0 and vddio. When vdd=1.2, vddio=4.8, and 0<vpad<4.8.

The voltage driver 300 also includes two impedance divider circuits 332, 334. The first impedance divider circuit 332 is placed between terminal 310 and the pad 314 to generate two voltage signals (referred to as padp1by4 and padp1by2) each of which is a fraction of a voltage between pad and vddio (referred to as padp), where padp1by4=padp/4, and padp1by2=padp/2. The second impedance divider circuit 334 is placed between pad 314 and terminal 312 to generate two voltage signals (referred to as padn2by4 and padn1by2) each of which is a fraction of a voltage between pad and vssio, where padn1by4=padn/4, and padn1by2=padn/2. In some embodiments, each of the first or second impedance divider circuits 332, 334 includes N identical resistor-capacitor (RC) circuits, and the four voltage signals are generated by the RC circuits. For example, as illustrated, when N=4, there are four identical circuits in each of the first or second impedance divider circuit 332, 334.

The voltage driver 300 also includes N−1 (=3) NMOS clampers 341-343 (each corresponding to the clamper 200A of FIG. 2A), and N−1 (=3) PMOS clampers 344-346 (each corresponding to the clamper 200B of FIG. 2B). As illustrated, each of the clampers 341-346 receives two input signals and generates one output signal. In particular, NMOS clamper 341 receives vrefp (=vddio1by4) and padp1by2 as input to generate an output signal denoted as pg_t, which is in turn input into the gate terminal of PMOS transistor 303 and the NMOS clamper 342. NMOS clamper 342 receives pg_t (output by NMOS clamper 341) and padp1by4 to generate an output signal denoted as pg_s, which is in turn input into the gate terminal of PMOS transistor 304 and NMOS clamper 343. NMOS clamper 343 receives pg_s (output by NMOS clamper 342) and pad as input to generate an output signal denoted as pg_p, which is in turn input into the gate terminal of PMOS transistor 305.

Similarly, PMOS clamper 346 receives vrefn (=vddio1by4) and padn1by2 as input to generate an output signal denoted as ng_t, which is in turn input to the gate terminal of NMOS 308 and PMOS clamper 345. PMOS clamper 345 receives ng_t (output by PMOS clamper 346) and padn3by4 to generate an output signal denoted as ng_s, which is in turn input into the gate terminal of NMOS transistor 307 and PMOS clamper 344. PMOS clamper 344 receives ng_s (output by PMOS clamper 345) and pad to generate an output signal denoted as ngp, which is in turn input into the gate terminal of NMOS transistor 306.

Further, the gate terminal of PMOS transistor 301 receives a data signal denoted as pd; the gate terminal of PMOS transistor 302 receives vrefp (vddio3by4); the gate terminal of NMOS transistor 301 receives a data signal denoted as nd, and the gate terminal of NMOS transistor 309 receives vrefn (vddio1by4). As such, the gates of PMOS transistors 303-305 and NMOS transistors 306-308 are dynamically controlled by vpad at pad, while the gates of PMOS transistors 301-302 and NMOS transistors 309-310 are fixed.

Example logic implemented in those clampers are shown in Table 2 below.

TABLE 2

| Driver devices | | gate voltages of driver devices | when pad = 4.8 V | when pad = 0 V | Treatment of devices gates | Dynamic Mux Implementation |
|---|---|---|---|---|---|---|
| PMOS main (data) (PMOS transistor 301) | PM | pg_m | pd (data) | pd (data) | Fix | pd (data) |
| PMOS quaternary (PMOS transistor 302) | PQ | pg_q | vddio3by4 | vddio3by4 | Fix | vddio3by4 |
| PMOS tertiary (PMOS transistor 303) | PT | pg_t | vddio3by4 | vddio1by2 | Dynamic Mux | min[vddio3by4, padp1by2] |
| PMOS secondary (PMOS transistor 304) | PS | pg_s | vddio3by4 | vddio1by4 | Dynamic Mux | min[pg_t, padp1by4] |
| PMOS primary (PMOS transistor 305) | PP | pg_p | vddio3by4 | pad | Dynamic Mux | min[pg_s, pad] |
| NMOS primary (NMOS transistor 306) | NP | ng_p | pad | vddio1by4 | Dynamic Mux | max[pad, ng_s] |
| NMOS secondary (NMOS transistor 307) | NS | ng_s | vddio3by4 | vddio1by4 | Dynamic Mux | max[padn3by4, ng_t] |
| NMOS tertiary (NMOS transistor 308) | NT | ng_t | vddio1by2 | vddio1by4 | Dynamic Mux | max[padn1by2, vddio1by4] |

TABLE 2-continued

| Driver devices | | gate voltages of driver devices | when pad = 4.8 V | when pad = 0 V | Treatment of devices gates | Dynamic Mux Implementation |
|---|---|---|---|---|---|---|
| NMOS quarternary (NMOS transistor 309) | NQ | ng_q | vddio1by4 | vddio1by4 | Fix | vddio1by4 |
| NMOS main (data) (NMOS transistor 301) | NM | ng_m | nd (data) | nd (data) | Fix | nd (data) |

A similar approach can be further extended for voltage drivers with higher vddio=N*vdd by simultaneously tapping three or more references from the pad impedance divider circuit and by increasing one more stacking at the driver. Generally, the driver includes (N+1) NMOS transistors, (N+1) PMOS transistors, (N−1) NMOS clampers, and (N−1) PMOS clampers. The two reference voltages are (N−1)*vddio/N and vddio/N. The two impedance divider circuit is configured to generate a first set of voltage signals as padp/N, 2*padp/N, . . . , (N−2)*padp/N; and a second set of voltage signals as (N−1)*padn/N, (N−2)*padn/N . . . 2*padn/N.

The above-described architectures are generally applicable to any high-voltage drivers, where N>2, although custom solutions, consistent with the principles described herein may also be implemented. For example, for 3*vdd, since the gates of PMOS secondary and NMOS secondary need same voltages, these 2 nodes, e.g., pg_s & ng_s, are also referred to as "gate_s". There can be various methods to generate the signal at gate_s node, two example methods are explained below.

Figure 4:
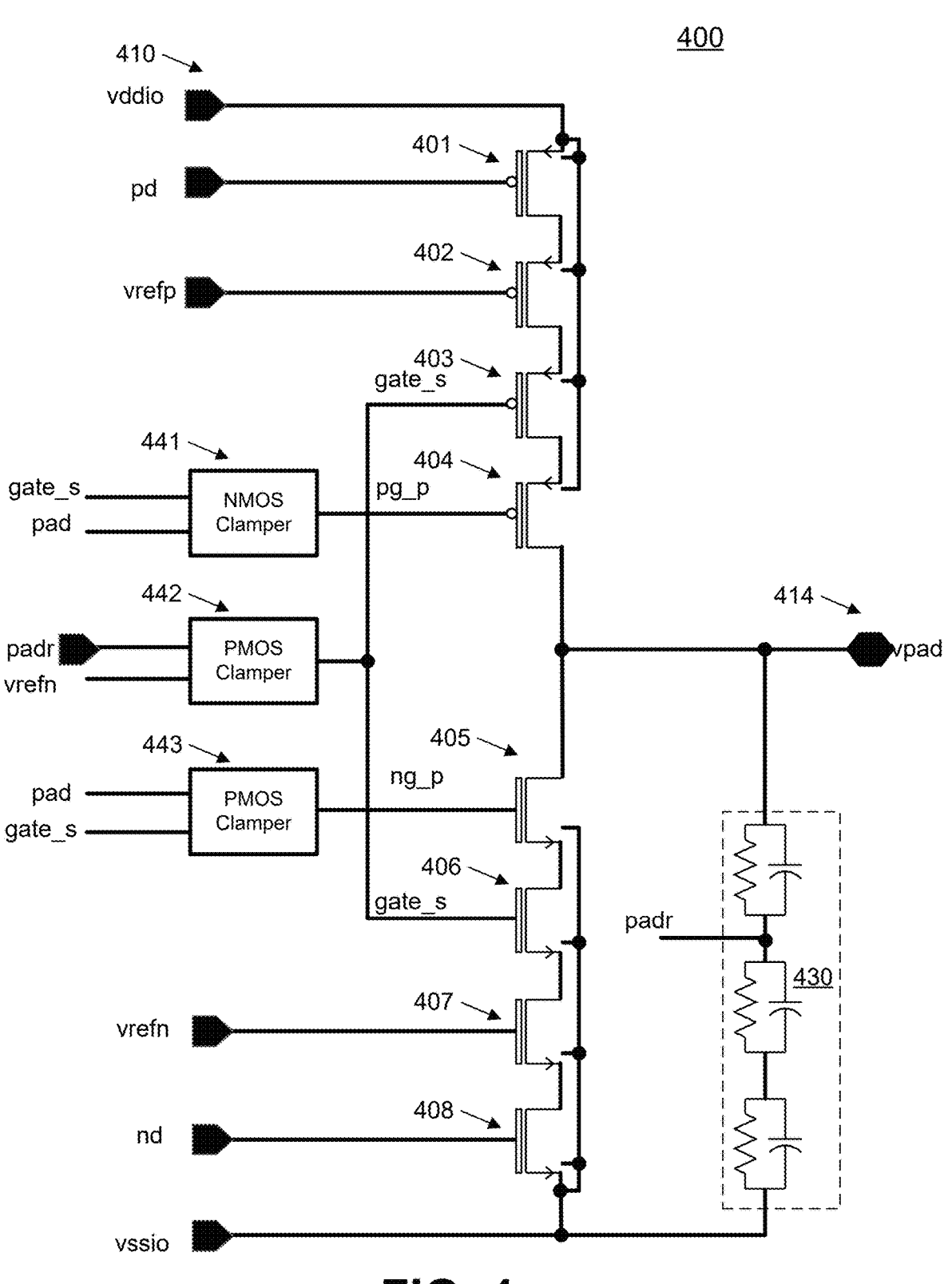
FIG. 4 illustrates another example architecture of a 3*vdd IO driver, in accordance with some embodiments.

FIG. 4 illustrates an example architecture of a 3*vdd driver 400 in accordance with an embodiment. As illustrated in FIG. 4, similar to the driver 100 of FIG. 1, the driver 400 includes four PMOS transistors 401-404 and four NMOS transistors 405-408.

On the other hand, unlike the driver 100 of FIG. 1, driver 400 includes a single impedance divider circuit 430 (e.g., an RC ladder) between the pad 414 to ground vssio, configured to generate padr=2*padn/3 signal. Further, the driver 400 only includes one NMOS clamper 441 (corresponding to clamper 200A of FIG. 2A) and two PMOS clampers 443 (each corresponding to clamper 200B of FIG. 2B). The PMOS clamper 442 receives padr and vrefn as input to generate an output denoted gate_s, which is input to the gate terminal of PMOS transistor 403, the gate terminal of NMOS transistor 406, and NMOS clamper 441, and PMOS clamper 443. NMOS clamper 441 takes gate_s (output from PMOS clamper 442) and pad as input to generate an output denoted pg_p, which is in turn input to the gate terminal of PMOS transistor 404. Similarly, PMOS clamper 443 takes gate_s (output from PMOS clamper 442) and pad as input to generate an output denoted pg_p, which is in turn input to the gate terminal of NMOS transistor 405.

Figure 5:
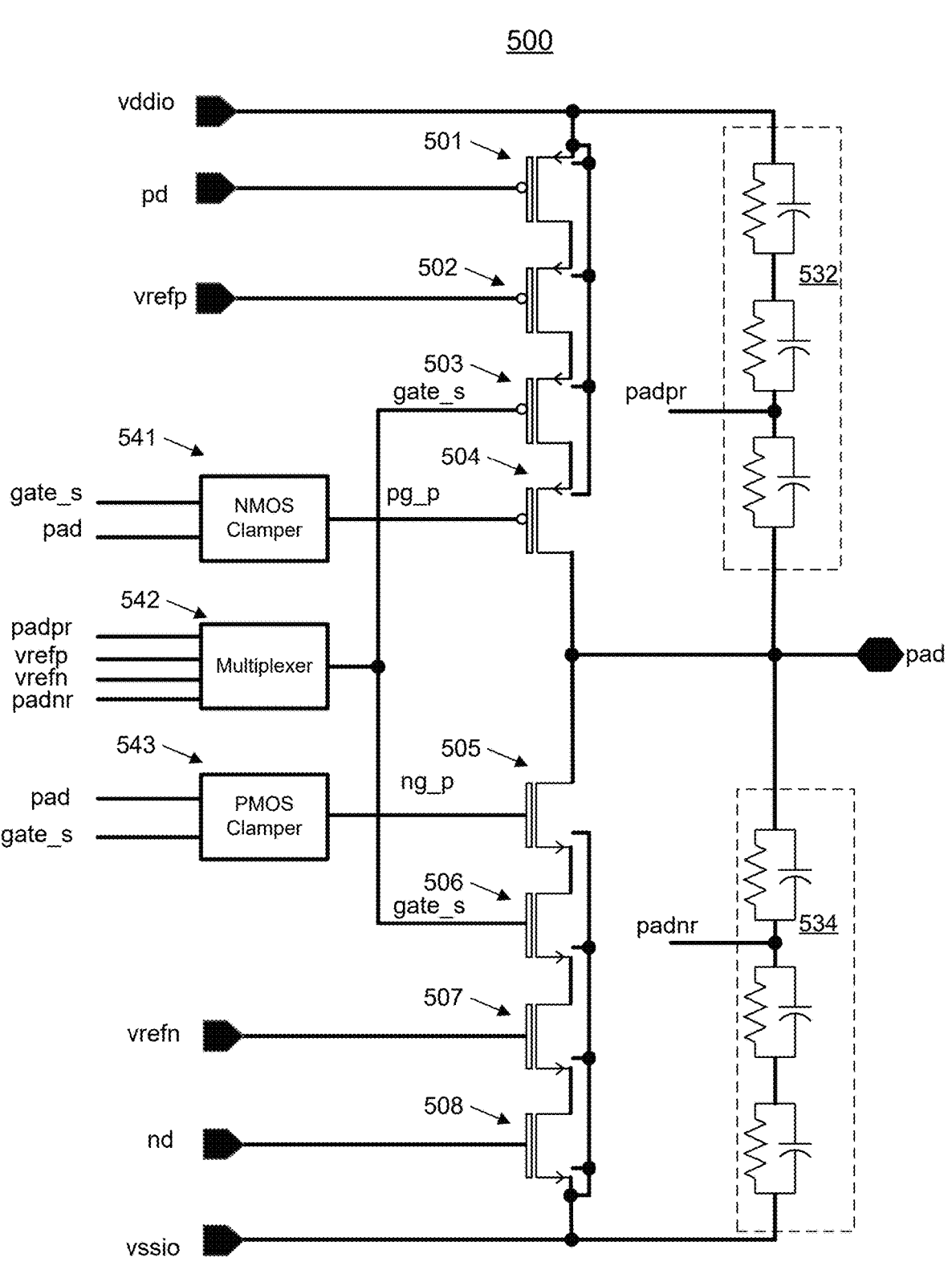
FIG. 5 illustrates another example architecture of a 3*vdd IO driver, in accordance with some embodiments.

FIG. 5 illustrates another example architecture of a 3*vdd driver 500 in accordance with another embodiment. As illustrated in FIG. 5, similar to driver 100 of FIG. 1, driver 500 includes four PMOS transistors 501-504 and four NMOS transistors 505-508. Driver 500 also includes a first impedance divider circuit 532 configured to generate a first voltage signal padpr (=padp/3), and a second impedance divider circuit 534 configured to generate a second voltage signal padpnr (=2*padn/3).

On the other hand, unlike driver 100 of FIG. 1, driver 500 includes a single NMOS clamper 541 (corresponding to NMOS clamper 200A of FIG. 2A), a single PMOS clamper 543 (corresponding to PMOS clamper 200B of FIG. 2B), and a multiplexer 542. The multiplexer 542 includes four input terminals and one output terminal.

Figure 6:
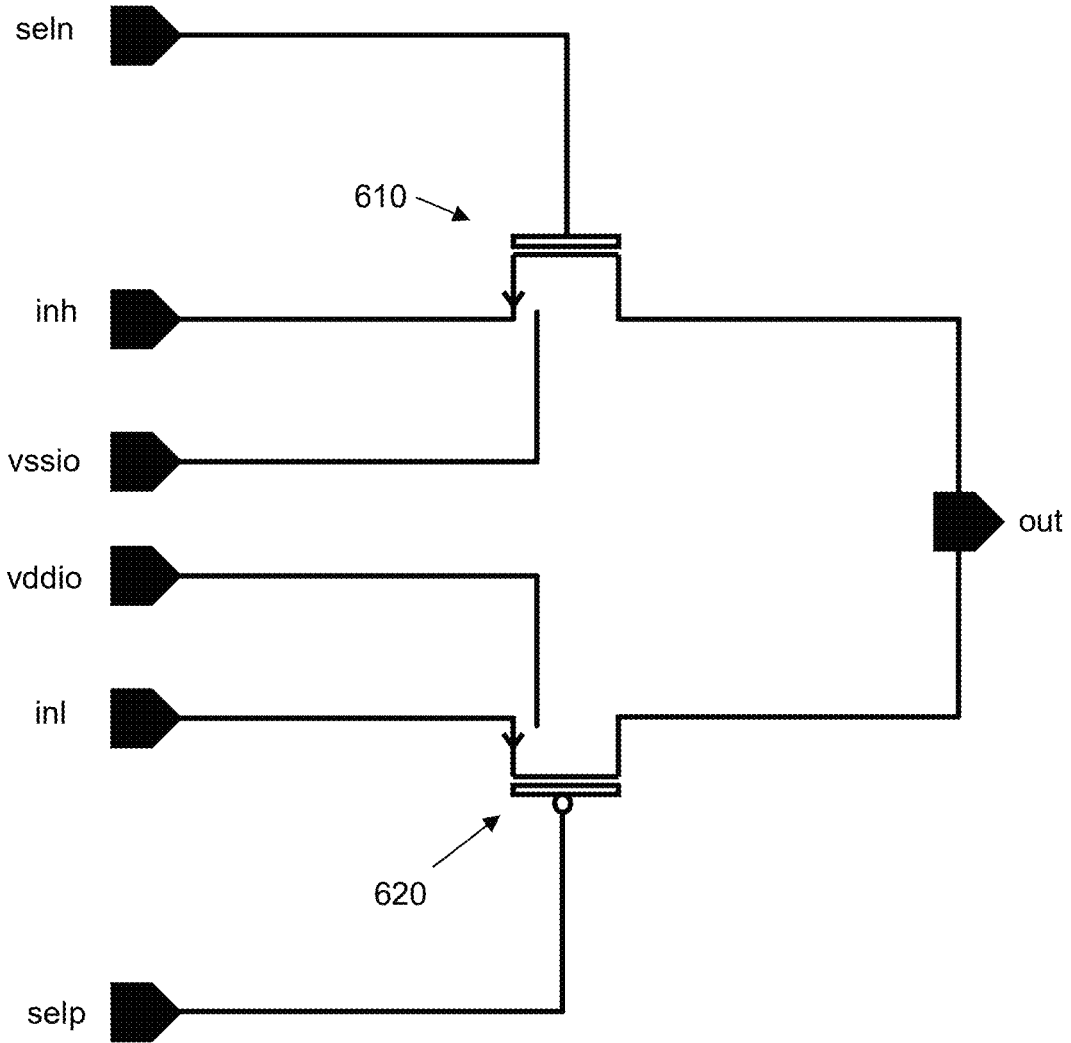
FIG. 6 illustrates an example architecture of a multiplexer, in accordance with some embodiments.

FIG. 6 illustrates an example multiplexer 600 corresponding to the multiplexer 542 of FIG. 5. As illustrated in FIG. 6, the multiplexer 600 includes an NMOS transistor 610 and a PMOS transistor 620. The drain terminal of the NMOS transistor 610 and the drain terminal of the PMOS transistor 620 are connected as output. Each of the source terminal and the gate terminal of the NMOS transistor 610, the source terminal and the gate terminal of the PMOS transistor 620 is an input terminal, denoted as seln, inh, inl, selp. The body of the NMOS transistor 610 is connected to vssio=ground, and the body of the PMOS transistor 620 is connected to vddio=3*vdd. The multiplexer is configured to output inh or inl, depending on the input of seln and/or selp.

Returning back to FIG. 5, the multiplexer 542 receives padpr, vrefp, vrefn, and padnr as inputs to an output denoted as gate_s, which is in turn input to the gate terminal of PMOS transistor 503, the gate terminal of NMOS transistor 506, and NMOS clamper 541, and PMOS clamper 543. NMOS clamper 541 receives gate_s and pad as input to generate an output denoted pg_p, which is in turn input to the gate terminal of PMOS transistor 504. PMOS clamper 543 receives gate_s and pad as input to generate an output denoted as ng_p, which is in turn input to the gate terminal of NMOS transistor 505.

Notably, drivers 400 and 500 of FIGS. 4-5 use fewer transistors to achieve the same or similar functionalities of driver 100 of FIG. 1. Example signals of the driver for the driver 400 or 500 are shown in Table 3 below.

TABLE 3

| Driver devices | | gate voltages of driver devices | when pad = 3.6 V | when pad = 0 V | Treatment of devices gates |
|---|---|---|---|---|---|
| PMOS main (data) | PM | pg_m | pd (data) | pd (data) | Fix |
| PMOS tertiary | PT | pg_t | vddio2by3 | vddio2by3 | Fix |
| PMOS secondary | PS | pg_s/ gate_s | vddio2by3 | vddio1by3 | Dynamic Mux |

TABLE 3-continued

| Driver devices | | gate voltages of driver devices | when pad = 3.6 V | when pad = 0 V | Treatment of devices gates |
|---|---|---|---|---|---|
| PMOS primary | PP | pg_p | vddio2by3 | pad | Dynamic Mux |
| NMOS primary | NP | ng_p | pad | vddio1by3 | Dynamic Mux |
| NMOS secondary | NS | ng_s/ gate_s | vddio2by3 | vddio1by3 | Dynamic Mux |
| NMOS tertiary | NT | ng_t | vddio1by3 | vddio1by3 | Fix |
| NMOS main (data) | NM | ng_m | nd (data) | nd (data) | Fix |

In some cases, when the power supply voltage (VDD) is at zero while the IO Pad is not at zero, this situation could cause voltages within the circuit to exceed the tolerance of the circuit's components. Transistors and other semiconductor devices within the circuit are typically designed to handle voltages close to their supply voltage (VDD). If they encounter voltages much higher than their intended range (which might be the case if VDD is zero but the IO pad is not), this can lead to breakdowns and permanent damage to the devices.

Figure 7A:
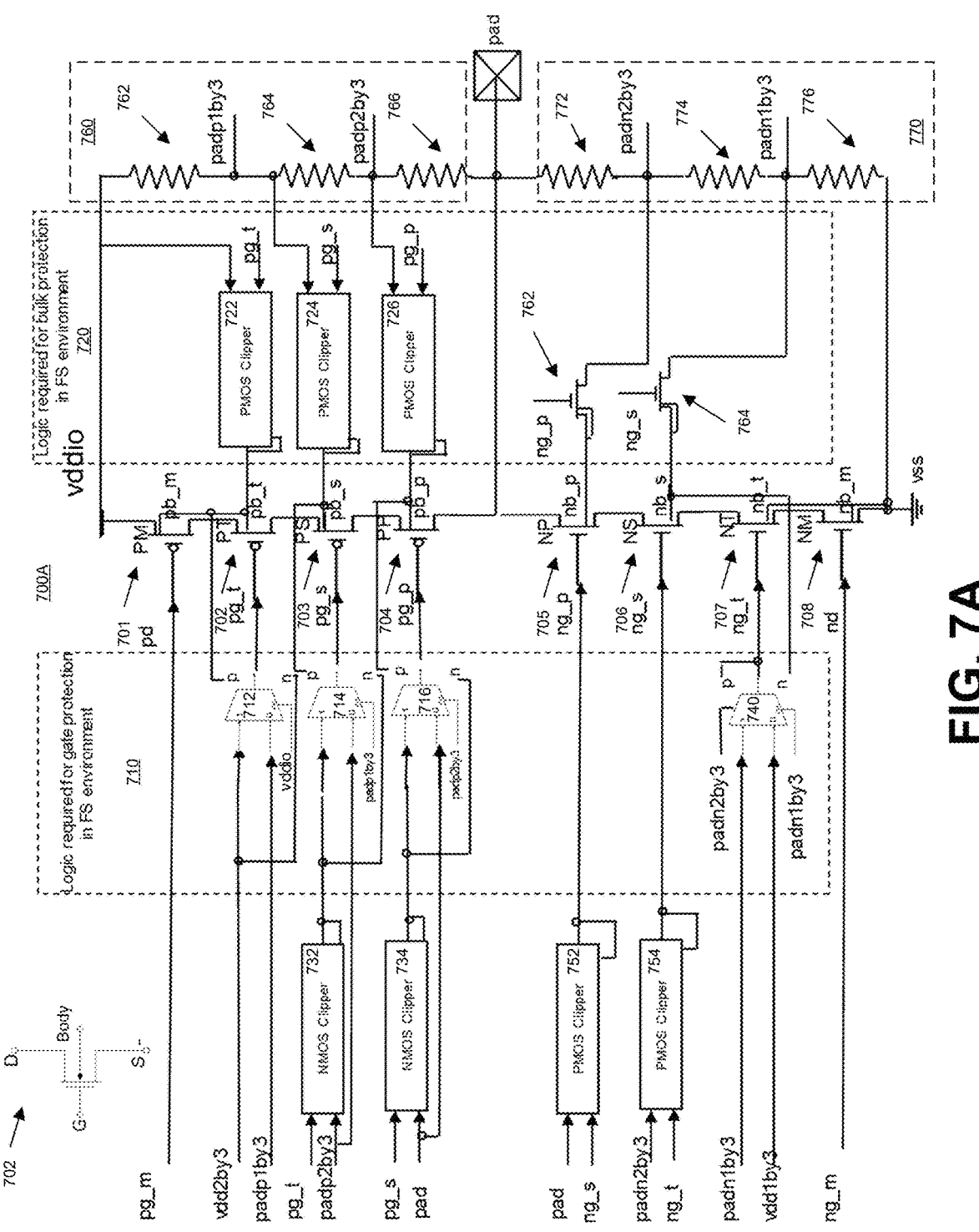
FIGS. 7A-7B illustrate embodiments of a 3*vdd fail-safe IO driver in accordance with some embodiments.
Figure 7B:
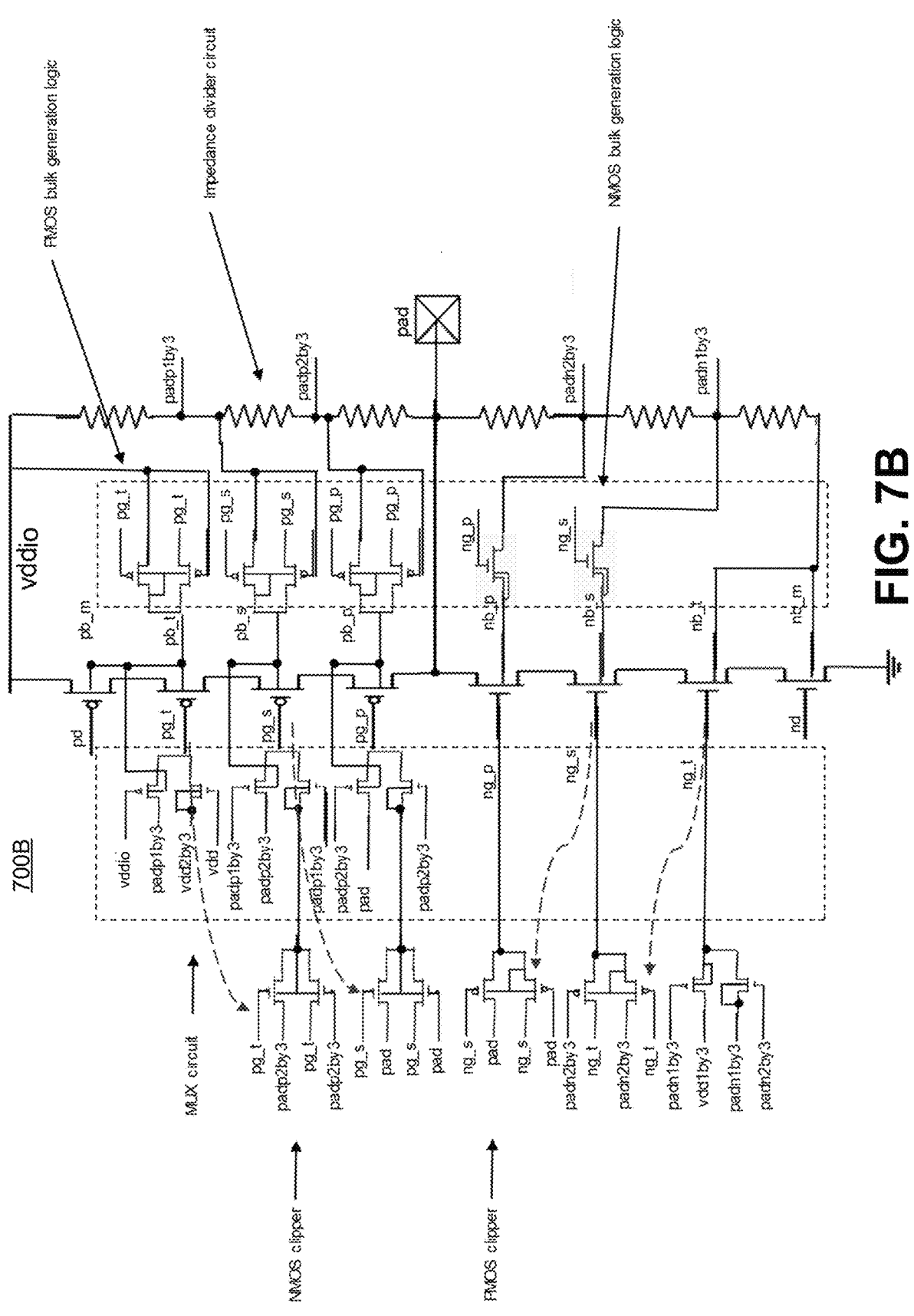
Figures 8A, 8B, 8C, 8D:
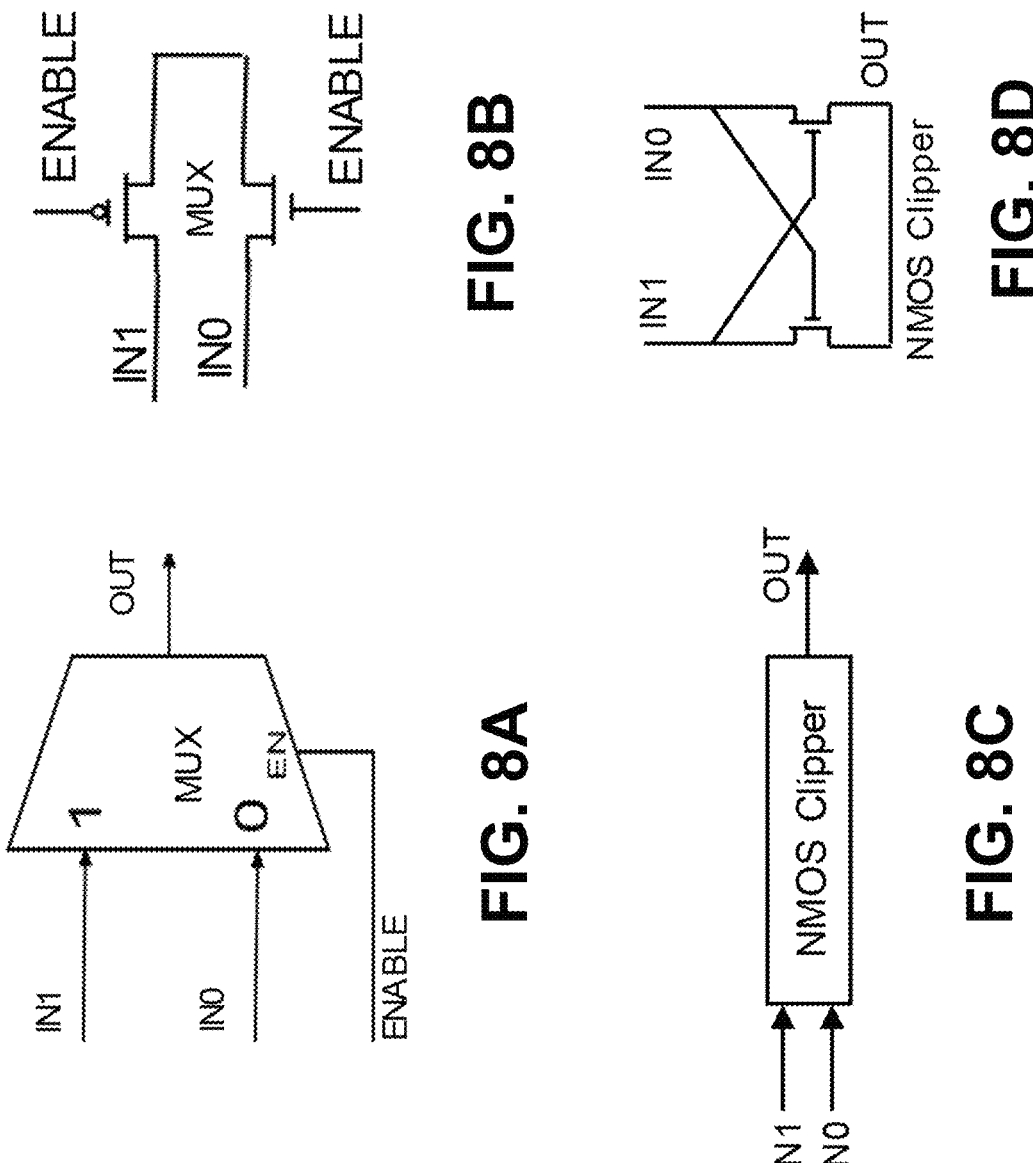
FIGS. 8A-8D illustrate components for P-driver controls in accordance with some embodiments.

FIGS. 7A and 8B illustrate embodiments of a fail-safe IO driver that solves the above-described problem in accordance with some embodiments. FIG. 7A is an example architecture of a 3*vdd fail-safe IO driver 700A. FIG. 7B illustrates a transistor-level circuit of the fail-safe IO driver 700B corresponding to the fail-safe IO driver 700A in FIG. 7A.

As illustrated in FIG. 7A, the fail-safe IO driver 700A includes a plurality of PMOS transistors 701-704 and a plurality of NMOS transistors 705-708 connected in series. In particular, the source of transistor 701 is connected to VDD, the drain of transistor 701 is coupled to the source of transistor 702, the drain of transistor 702 is coupled to the source of transistor 703, the drain of transistor 703 is coupled to the source of transistor 704, the drain of transistor 704 is coupled to the drain of transistor 705, the source of transistor 705 is coupled to the drain of transistor 706, the source of transistor 706 is coupled to the drain of transistor 707, and the source of transistor 707 is coupled to the drain of transistor 708, and the source of transistor 708 is coupled to VSS (ground).

The fail-safe IO driver 700A also includes a first impedance divider circuit 760 and a second impedance divider circuit 770 that generates a plurality of voltage signals. The first impedance divider circuit 760 includes a plurality of resistors 762, 764, 766 connected between VDD and pad in series to generate voltage signals, padp1by3 and padp2by3. Similarly, the second impedance divider circuit 770 also includes a plurality of resistors 772, 774, and 776 to generate voltage signals, padn1by3 and padn2by3. There may be an additional impedance divider circuit (not shown) between VDD and VSS that generates fractions of VDD, e.g., vdd1by3 and vdd2by3.

The fail-safe IO driver 700A further includes a gate protection circuit 710 and a bulk protection circuit 720. The gate protection circuit 710 is placed between the clampers 732, 734, 752, 754 and gates of the transistors 701-708 to protect gate oxide of the transistors from excessive voltages that could cause a breakdown or degradation of the oxide layer. The bulk protection circuit 720 is placed between bodies of transistors 701-708 and the impedance divider circuit 760, 770 to protect bodies (or substrate) of the transistors from unwanted parasitic effects, which includes (but is not to) preventing latch-up, stabilizing the threshold voltage, and reducing noise and parasitic capacitance.

A top left corner of FIG. 7A illustrates an enlarged view of transistor 702, including a gate G, a drain D, a source S, and a body (also referred to as "substrate" or bulk). The body of the transistor 702 is a semiconductor material that forms the main structure of the transistor 702. It can affect the behavior of the transistor 702 through the body effect, where a voltage difference between the body and the source can change the threshold voltage required at the gate G to turn the transistor on. Similarly, each of the transistors 703-708 also includes a body.

The gate protection circuit 710 includes three MUX 712, 714, 716, and an MUX 740. Inputs of MUX 712 are connected to signals vdd2by3 and padp1by3, and an output of the MUX 712 is connected to a gate of PMOS transistor 702. Inputs of MUX 714 are connected to an output of NMOS clipper 732 and a signal padp2by3, and an output of the MUX 714 is connected to a gate of PMOS transistor 703. Inputs of MUX 716 are connected to an output of NMOS clipper 734, and an output of the MUX 716 is connected to a gate of PMOS transistor 704.

Signal pg_m (also referred to as pd) is input to the gate of PMOS transistor 701, signal pg_t is input to the gate of PMOS transistor 702, signal pg_s is input to the gate of PMOS transistor 703, and signal pg_p is input to the gate of PMOS transistor 704. Further, signal ng_p is input to the gate of NMOS transistor 705, signal ng_s is input to the NMOS transistor 706, signal ng_t is input to the NMOS transistor 707, and signal ng_m (also referred to as nd) is input to the NMOS transistor 708.

Example signals pg_m, pg_t, pg_s, pg_p, ng_p, ng_s, ng_t, and ng_m are shown below in Table 4.

TABLE 4

| Driver Gate Signals | Gate signal when pad = 0 V, vdd = 3.6 V | Gate signal when pad = 3.6 V, vdd = 3.6 V | Gate signal when pad = 3.6 V, vdd = 0 |
|---|---|---|---|
| pg_m | pd (data) | pd (data) | pd (data) |
| pg_t | padp1by3 | vdd2by3 | padp1by3 |
| pg_s | padp2by3 | vdd2by3 | padp2by3 |
| pg_p | pad | vdd2by3 | pad |
| ng_p | vdd1by3 | pad | pad |
| ng_s | vdd1by3 | padn2by3 | padn2by3 |
| ng_t | vdd1by3 | padn1by3 | padn1by3 |
| ng_m | nd (data) | nd (data) | nd (data) |

The bulk protection circuit 720 includes three PMOS clippers 722, 724, 726, and NMOS transistors 762, 764. Inputs of PMOS clipper 722 are connected to VDD and signal pg_t, and an output of PMOS clipper 722 is connected to a body of the PMOS transistor 702. Inputs of PMOS clipper 724 are connected to signals padp1by3 and pg_s, and an output of PMOS clipper 724 is connected to the body of the PMOS transistor 703. Inputs of PMOS clipper 726 are connected to signals padp2by3 and pg_p, and an output of PMOS clipper 724 is connected to a body of the PMOS transistor 704. A source and a drain of the NMOS transistor 762 are connected to the body of the NMOS transistor 705 and signal padn2by3 respectively. A source and a drain of the NMOS transistor 764 are connected to the body of the NMOS transistor 706 and signal padn1by3.

In particular, body of PMOS transistor 701 is connected to signal pb_m, body of PMOS transistor 702 is connected to signal pb_t, body of PMOS transistor 703 is connected to signal pb_s, and body of PMOS transistor 704 is connected to signal pb_p. Further, body of NMOS transistor 705 is connected to nb_p, body of NMOS transistor 706 is connected to nb_s, body of NMOS transistor 707 is connected to nb_t, and body of NMOS transistor 708 is connected to nb_m.

Example signals pb_m, pb_t, pb_s, pb_p, nb_p, nb_s, nb_t, and nb_m are shown below in Table 5.

TABLE 5

| Bulk signal when pad = 0 V, vdd = 3.6 V | Bulk signal when pad = 3.6 V, vdd = 3.6 V | Bulk signal when pad = 3.6 V, vdd = 0 | Driver Bulk Signals |
|---|---|---|---|
| vdd | pad | padp1by3 | pb_m |
| vdd | pad | padp1by3 | pb_t |
| padp1by3 | pad | padp2by3 | pb_s |
| padp2by3 | pad | pad | pb_p |
| VSS | padn2by3 | padn2by3 | nb_p |
| VSS | padn1by3 | padn1by3 | nb_s |
| VSS | VSS | VSS | nb_t |
| VSS | VSS | VSS | nb_m |

Referring to FIG. 7B, in some embodiments, each of the MUX 712, 714, 716 includes two transistors, and each of the PMOS clippers 722, 724, 726 also includes two transistors. An enlarged view of the MUX 712, 714, 716 and PMOS clipper 722, 724, and 226 are further illustrated in FIGS. 8A-81D.

FIGS. 8A-81D illustrate components for P-driver controls in accordance with some embodiments. The P-driver controls are circuits connected to the plurality of PMOS transistors 701-704 in FIG. 7A. FIG. 8A is a schematic diagram of an example multiplexer (MUX), which corresponds to MUX 712, 714, or 716. It shows how the multiplexer is connected to select one of two input signals, IN0 or IN1, based on the enable signal (EN) and route the selected input to the output (OUT). FIG. 8B is a transistor-level circuit diagram of an example MUX corresponding to the MUX shown in FIG. 8A. FIG. 8C is a schematic diagram of an example NMOS clipper, which corresponds to NMOS clipper 732, or 734 in FIG. 7A. FIG. 8D is a transistor-level circuit diagram of an example NMOS clipper corresponding to the NMOS clipper shown in FIG. 8B.

Figures 9A, 9B, 9C, 9D:
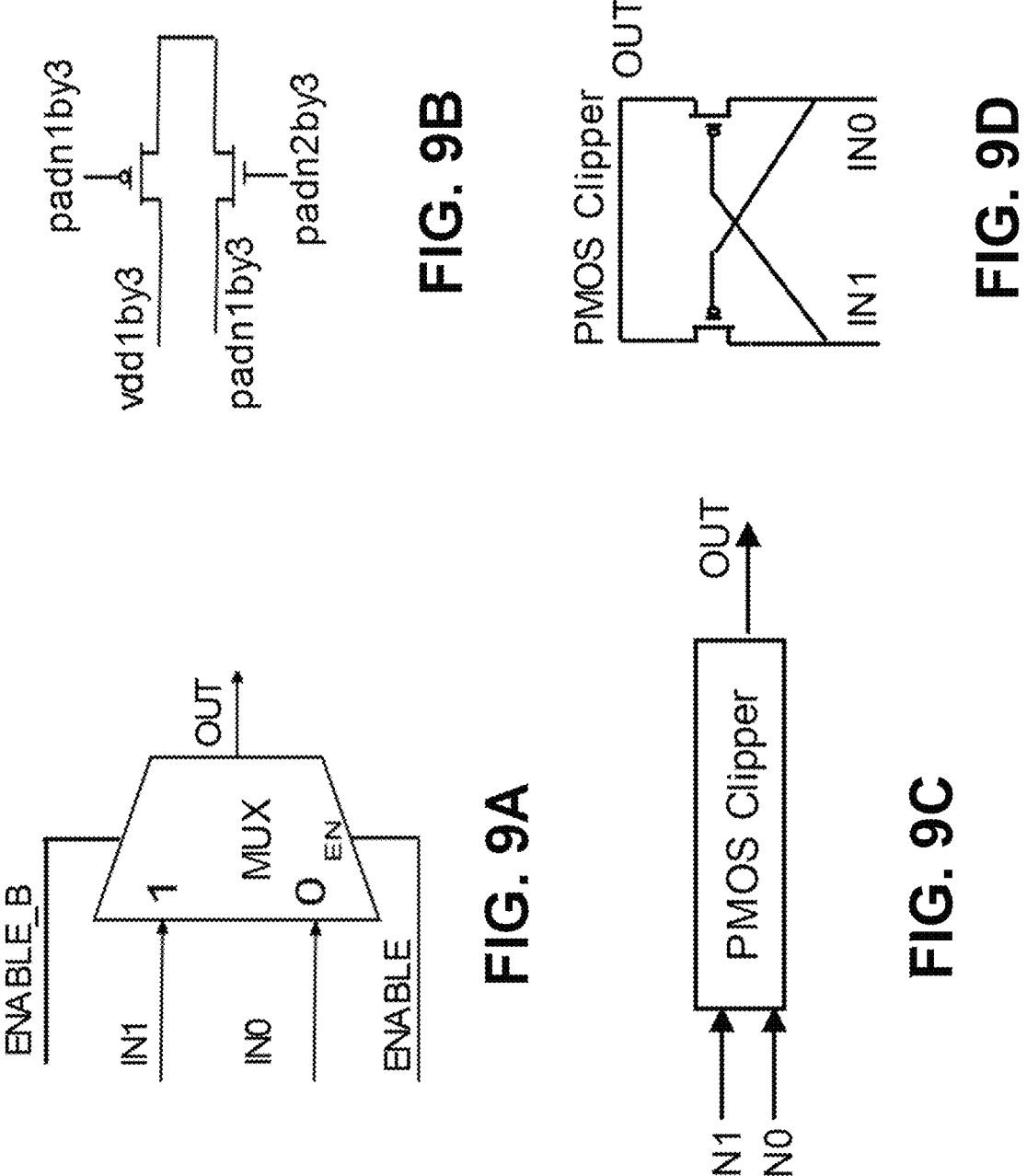
FIGS. 9A-9D illustrate components for N-driver controls in accordance with some embodiments.

FIG. 9A-9D illustrate components for N-driver controls in accordance with some embodiments. The N-driver controls are circuits connected to the plurality of NMOS transistors 705-708 in FIG. 7A. FIG. 9A is a schematic diagram of an example MUX. FIG. 9B is a transistor-level circuit diagram of an example MUX corresponding to the MUX shown in FIG. 9A. In some embodiments, the MUX in P-driver controls (shown in FIGS. 8A-8B) are same as the MUX in N-driver controls (shown in FIGS. 9A-9B). Alternatively, the MUX in P-driver controls may include PMOS transistors, and the MUX in N-driver controls may include NMOS transistors, or vice versa.

FIG. 9C is a schematic diagram of an example PMOS clipper, which corresponds to PMOS clipper 752, or 754 in FIG. 7A. FIG. 9D is a transistor-level circuit diagram of an example PMOS clipper corresponding to the PMOS clipper shown in FIG. 9C.

Figure 10:
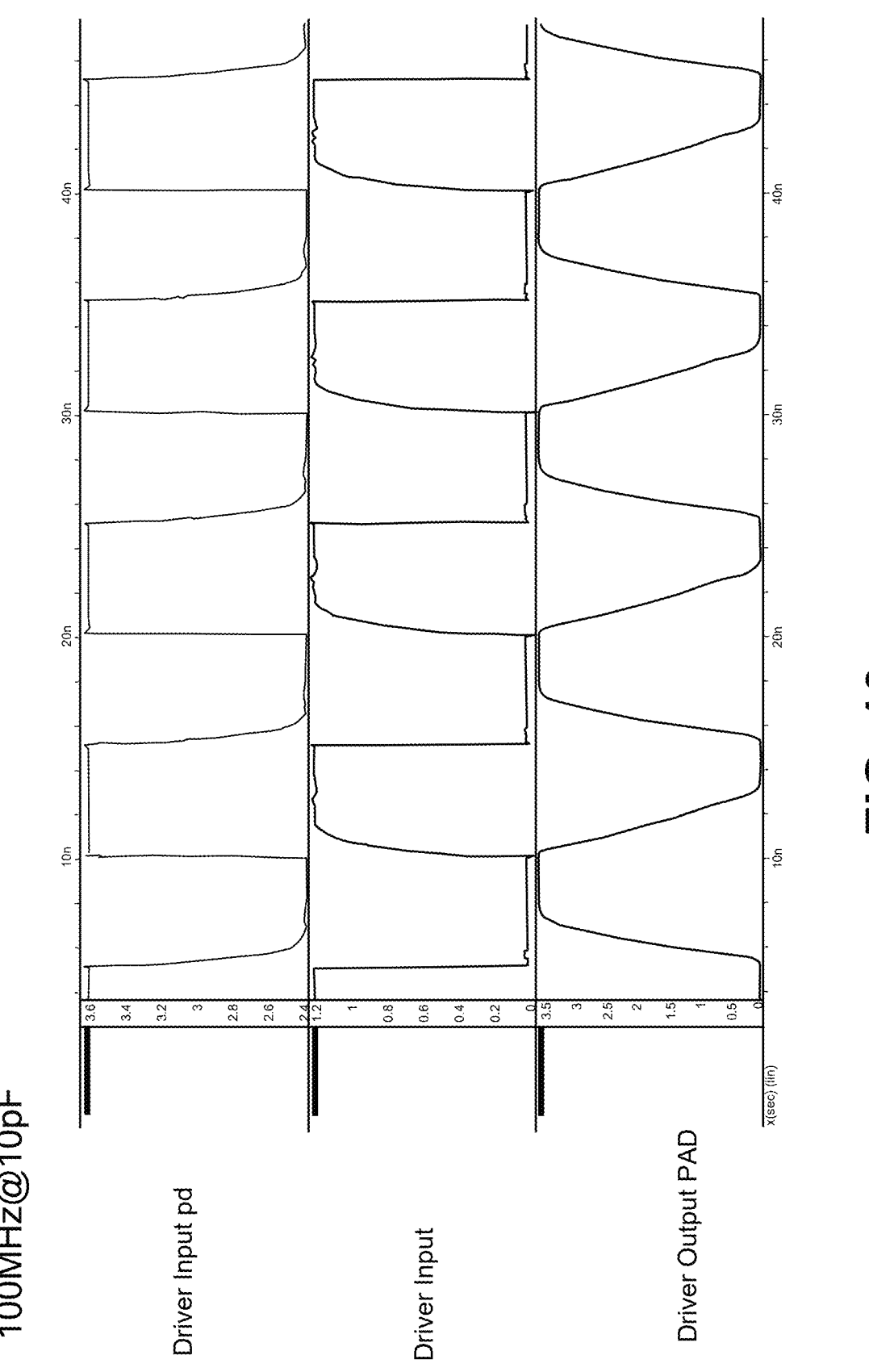
FIG. 10 is an example waveform depicting behavior of a 3*vdd supply fail-safe IO driver in accordance with some embodiments.

FIG. 10 is an example waveform depicting behavior of a 3*vdd supply fail-safe IO driver (which may correspond to the 3*VDD supply fail-safe IO driver 700A or 700B shown in FIG. 7A or 7B) in accordance with some embodiments. As illustrated in FIG. 10, driver input pd signal (shown at the top) is an alternating waveform between a high of 3.6 V and a low of 2.4 V. Driver input nd (shown in the middle) is another alternating waveform between a high of 1.2 V and a low of 0 V. Driver output PAD is an alternating waveform between a high of 3.6 V and a low of 0 V.

Figure 11:
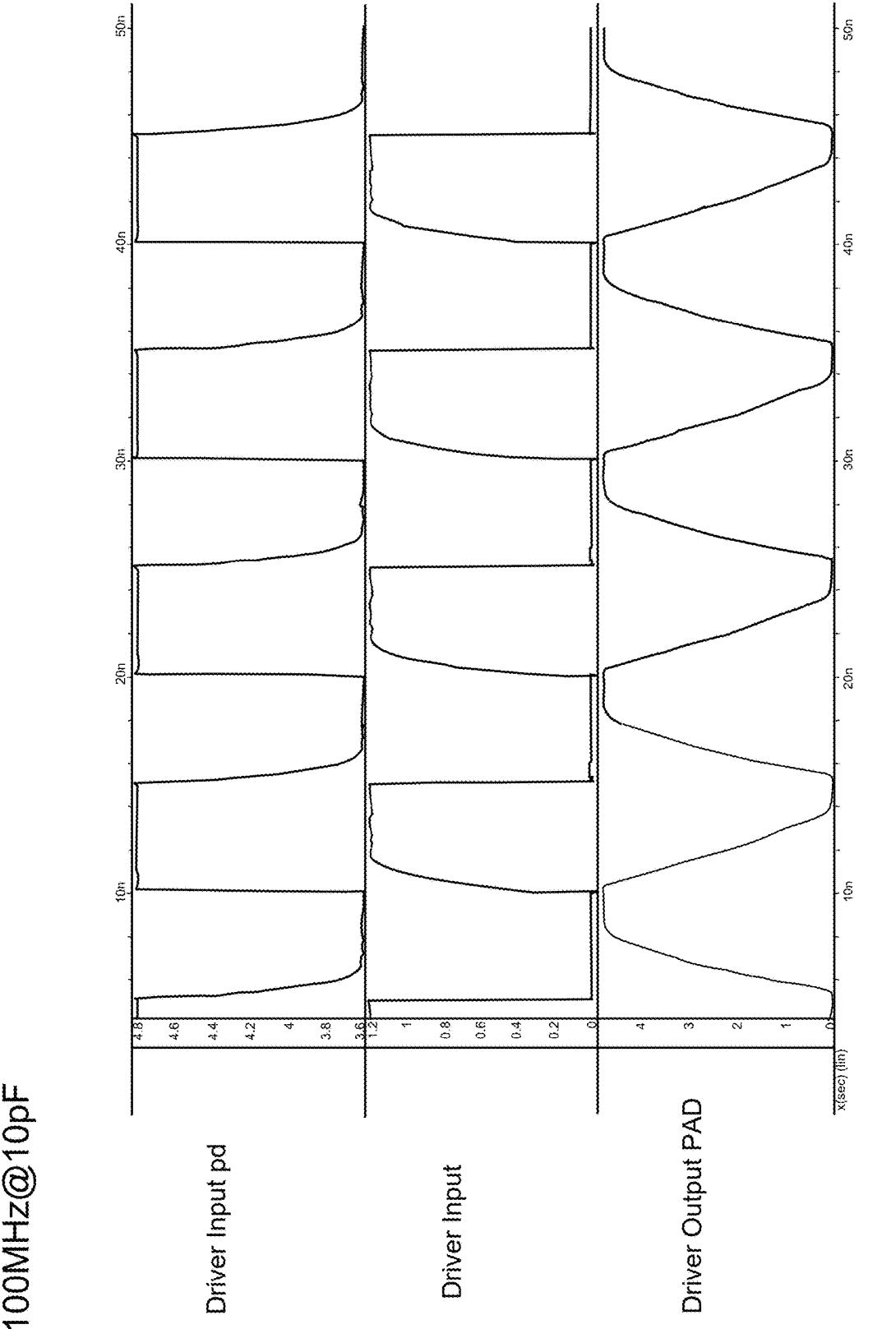
FIG. 11 is an example waveform depicting behavior of a 4*vdd supply fail-safe IO driver in accordance with some embodiments.

FIG. 11 is an example waveform depicting behavior of a 4*VDD supply fail-safe IO in accordance with some embodiments. As illustrated, driver input pd signal (shown at the top) is an alternating waveform between a high of 4.8 V and a low of 3.6 V. Driver input nd (shown in the middle) is another alternating waveform between a high of 1.2 V and a low of 0 V. Driver output PAD is another alternating waveform between a high of 4.8 V and a low of 0 V.

Figure 12A:
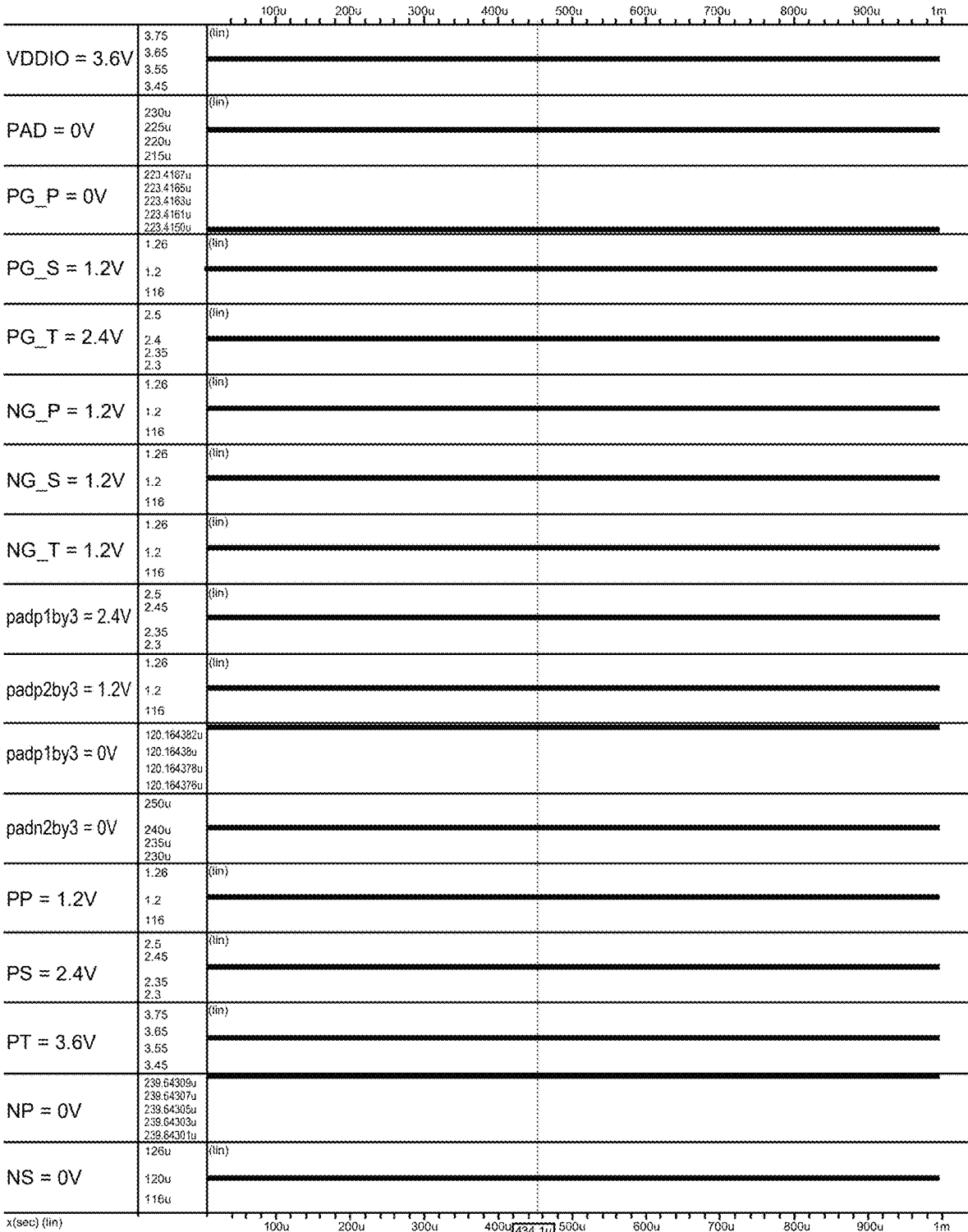
FIGS. 12A-12C are example signal voltages of a 3*vdd supply fail-safe IO driver based on different conditions or settings for voltage levels of PAD and VDD voltages in accordance with some embodiments.
Figure 12B:
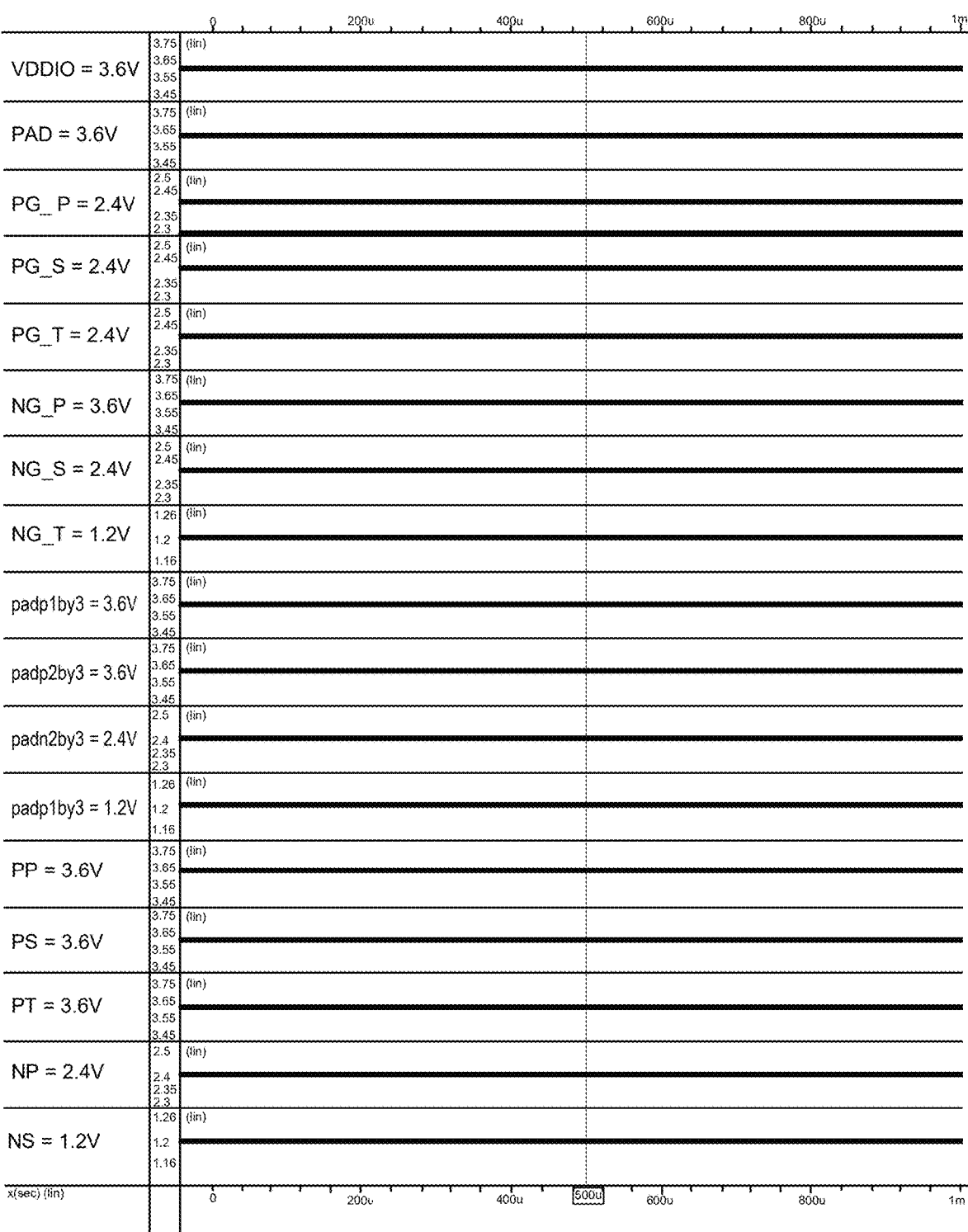
Figure 12C:
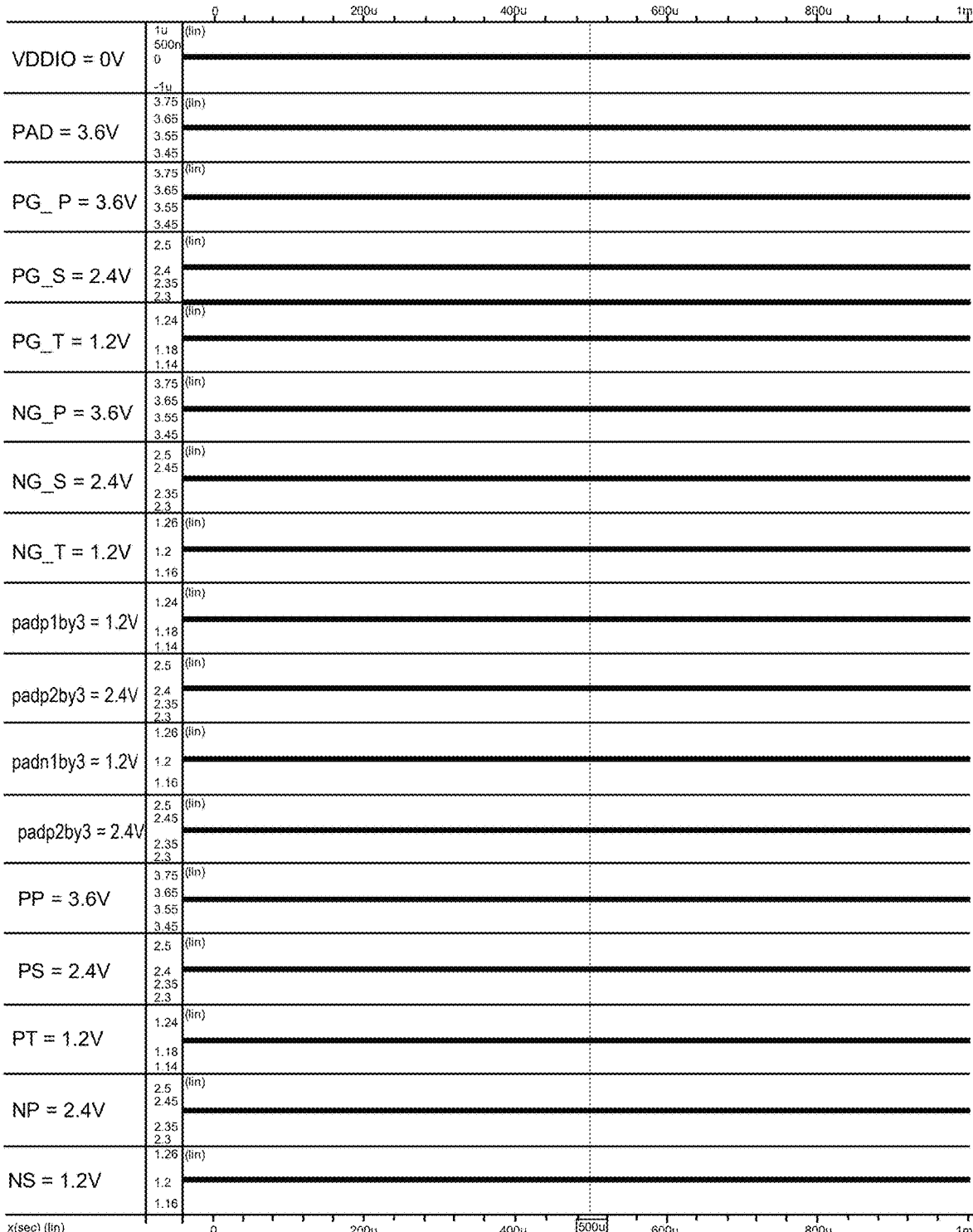

FIGS. 12A-12C are example signal voltages of a 3*VDD supply fail-safe IO driver described herein based on different conditions or settings for voltage levels of PAD and VDD voltages. In particular, FIG. 12A shows a scenario where PAD is at 0 V, and VDD is at 3.6 V. The following list provides the signal voltages with this scenario:

PG P—0V
PG S—1.2V
PG T—2.4V
NG P—1.2V
NG S—1.2V
NG T—1.2V
padpb1y3—2.4V
padpb2y3—1.2V
padnhb1y3—0V
padnb2y3—0V
PP—1.2V
PS—2.4V
PT—3.6V
NP—0V
NS—0V FIG. 12B shows a scenario where PAD is at 3.6 V, and VDD is at 3.6 V. The following list provides the signal voltages with this scenario:

PG P—2.4V
PG S—2.4V
PG T—2.4V
NG P—3.6V
NG S—2.4V
NG T—1.2V
padpb1y3—3.6V
padpb2y3—3.6V
padnhb1y3—2.4V
padnb2y3—1.2V
PP—3.6V
PS—3.6V
PT—3.6V
NP—2.4V
NS—1.2V FIG. 12C shows a scenario where PAD is at 3.6 V, and VDD is at 0 V. The following list provides the signal voltages with this scenario:

PG P—3.6V
PG S—2.4V
PG T—1.2V
NG P—3.6V
NG S—2.4V
NG T—1.2V
padpb1y3—1.2V
padpb2y3—2.4V
padnhb1y3—0V
padnb2y3—0V
PP—3.6V
PS—2.4V
PT—1.2V

NP—2.4V

NS—1.2V

As illustrated, the examples of the voltages indicate that the IO driver is fail-safe. This is because when the primary power source (VDD) is 0 and PAD is not zero, none of the voltage signals between any transistors exceeds the threshold, e.g., 1.2 V.

Notably, the above-described fail-safe IO driver 700A, 700B are 3*vdd IO driver. An ordinary person in the art would understand that the same or similar principles may also be implemented in a 4*vdd IO or even higher voltage IO. Example signals for a 4*vdd IO driver are shown below in Tables 6-7.

TABLE 6

| Driver Gate Signals | Gate signal when pad = 0 V, vdd = 4.8 V | Gate signal when pad = 4.8 V, vdd = 4.8 V | Gate signal when pad = 4.8 V, vdd = 0 |
|---|---|---|---|
| pg_m | pd (data) | pd (data) | pd (data) |
| pg_q | padp1by4 | vdd3by4 | padp1by4 |
| pg_t | padp1by2 | vdd3by4 | padp1by2 |
| pg_s | padp3by4 | vdd3by4 | padp3by4 |
| pg_p | pad | vdd3by4 | pad |
| ng_p | vdd1by4 | pad | pad |
| ng_s | vdd1by4 | padn3by4 | padn3by4 |
| ng_t | vdd1by4 | padn1by2 | padn1by2 |
| ng_q | vdd1by4 | padn1by4 | padn1by4 |
| ng_m | nd (data) | nd (data) | nd (data) |

TABLE 7

| Bulk signal when pad = 0 V, vdd = 4.8 V | Bulk signal when pad = 4.8 V, vdd = 4.8 V | Bulk signal when pad = 4.8 V, vdd = 0 | Driver Bulk Signals |
|---|---|---|---|
| vdd | pad | padp1by4 | pb_m |
| vdd | pad | padp1by4 | pb_q |
| padp1by4 | pad | padp1by2 | pb_t |
| padp1by2 | pad | padp3by4 | pb_s |
| padp3by4 | pad | pad | pb_p |
| VSS | padn3by4 | padn3by4 | nb_p |
| VSS | padn1by2 | padn1by2 | nb_s |
| VSS | padn1by4 | padn1by4 | nb_t |
| VSS | VSS | VSS | nb_q |
| VSS | VSS | VSS | nb_m |

Embodiments described herein include a voltage driver for supplying a supply voltage (referred to as vddio). The voltage driver includes a plurality of PMOS transistors connected in series and a plurality of NMOS transistors connected in series. Each PMOS transistor or NMOS transistor has a drain-source voltage between a drain terminal and a source terminal (referred to as VDD). A maximum of the supply voltage is N times a maximum of the drain-source voltage, where N>2.

The voltage driver also includes a pad, a first impedance divider circuit, and a second impedance divider circuit. The pad receives a voltage signal (vpad) for controlling gates of a subset of the plurality of NMOS transistors and a subset of the plurality of PMOS transistors. The first impedance divider circuit is coupled to the supply voltage and the pad. The first impedance divider circuit generates a first set of voltage signals that are fractions of a voltage (also referred to as padp) between the pad and vddio. The second impedance divider circuit is coupled to the pad and ground. The second impedance divider circuit generates a second set of voltage signals that are fractions of a voltage (also referred to as padn) between the pad and ground.

The voltage driver also includes a plurality of NMOS clampers that receive the first set of voltage signals to output a third set of voltage signals, and a plurality of PMOS clampers that receive the second set of voltage signals to output a fourth set of voltage signals. The voltage driver also includes a gate protection circuit coupled to outputs of the plurality of NMOS clampers and gates of a subset of the plurality of PMOS transistors respectively to protect gates of the subset of the plurality of PMOS transistors, and a bulk protection circuit coupled to bodies of the plurality of PMOS transistors and the first impedance divider circuit to protect the bodies of the plurality of the PMOS transistors.

In some embodiments, the gate protection circuit includes a plurality of PMOS multiplexers between the plurality of NMOS clampers and gates of a subset of the plurality of PMOS transistors.

In some embodiments, the plurality of PMOS multiplexers includes a first PMOS multiplexer (e.g., MUX 712 in FIG. 7A) that receives a first voltage signal (e.g., vdd2by3) and a second voltage signal (e.g., padp1by3) different from the first voltage signal, and selectively outputs one of the first voltage signal or the second voltage signal based on a control signal (vddio). The output of the first PMOS multiplexer is connected to a gate of a first PMOS transistor (e.g., transistor 702 in FIG. 7A).

In some embodiments, the plurality of PMOS multiplexers includes a second PMOS multiplexer (e.g., MUX 714 in FIG. 7A) that receives a third voltage signal (e.g., padp2by3) and an output of an NMOS clamper (e.g., NMOS clamper 732 in FIG. 7A) based on a control signal that corresponds to the second voltage signal (e.g., pad1by3). The output of the second PMOS multiplexer connected to a gate of a second PMOS transistor (e.g., PMOS transistor 703).

In some embodiments, the bulk protection circuit includes a plurality of PMOS clampers (e.g., clampers 722, 724, 726) between bodies of the plurality of PMOS transistors (e.g., transistors 702-704) and the first impedance driver (e.g., impedance driver 760). In some embodiments, the plurality of PMOS clampers includes a first PMOS clamper configured to receive vddio and a first voltage signal (e.g., pg_t) to output a second voltage signal (e.g., pb_t), which is connected to a body of a first PMOS transistor (e.g., PMOS transistor 702).

In some embodiments, the plurality of PMOS clampers further includes a second PMOS clamper that receives a second voltage signal (e.g., padp1by3) and a third voltage signal (e.g., pg_s) to output a fourth voltage signal (e.g., pb_s), which is connected to a body of a second PMOS transistor (e.g., PMOS transistor 703).

In some embodiments, the gate protection circuit is also between outputs of the plurality of PMOS clampers and gates of a subset of the plurality of NMOS transistors to protect gates of the subset of the plurality of NMOS transistors. The bulk protection circuit is also between bodies of the plurality of NMOS transistors and the second impedance divider circuit, and the bulk protection circuit is further configured to protect the bodies of the plurality of NMOS transistors. In some embodiments, the gate protection circuit further includes an NMOS multiplexer (e.g., MUX 740) that receives two voltage signals (e.g., padn1by3 and vdd1by3) and outputs one of the two voltage signals to a gate of one of the plurality of NMOS transistors (e.g., transistor 707).

In some embodiments, the bulk protection circuit further includes a plurality of additional NMOS transistors (e.g., transistors 762, 764) between the bodies of a subset of the plurality of NMOS transistors and the second impedance driver (e.g., impedance driver 770).

In some embodiments, vpad swings between 0 and vddio. In some embodiments, the plurality of PMOS transistors includes N+1 PMOS transistors, and the plurality of PMOS transistors includes N+1 NMOS transistors.

In some embodiments, the plurality of PMOS clampers include N−1 PMOS clampers, and the plurality of NMOS clampers comprises N−1 NMOS clampers. In some embodiments, each of the plurality of NMOS clampers includes two interconnected NMOS transistors configured to receive two voltage signals and output a minimum of the two voltage signals. Each PMOS clamper of the plurality of PMOS clampers includes two interconnected PMOS transistors that receives two voltage signals and output a maximum of the two voltage signals.

In some embodiments, the first impedance divider circuit or the second impedance divider circuit includes N identical resistors. Vrefn=vddio/N, and vrefp=(N−1)*vddio/N. In some embodiments, the voltage signals include a signal corresponding to padp/N or multiples of padp/N.

The above-described IO supply drivers 100, 300, 400, 500, or 700 may first be designed or integrated into a design of a more complex project via a software platform implemented on a computer system. The design may then be fabricated into a device.

Figure 13:
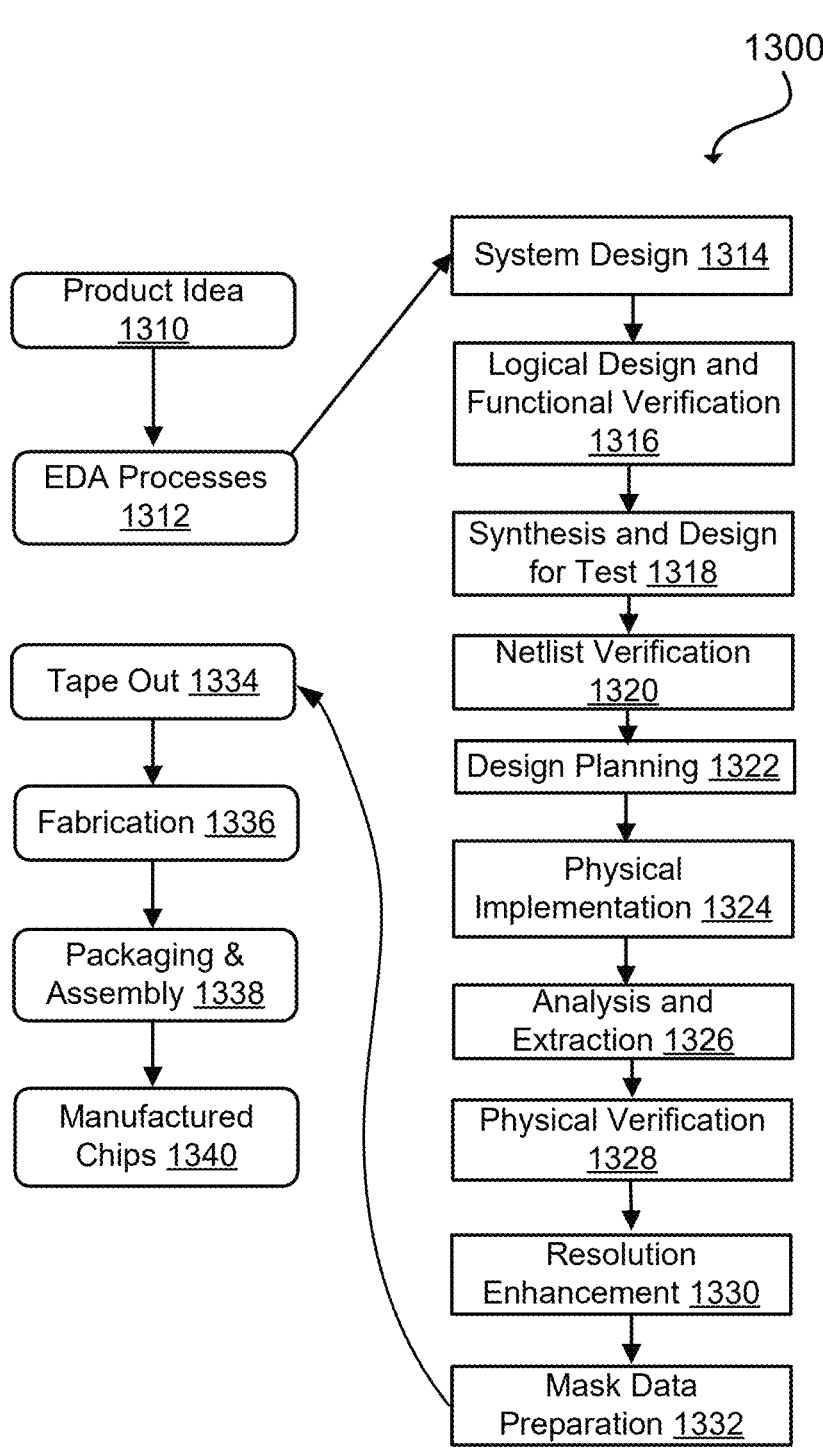
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1310 with information supplied by a designer, information which is transformed to create an article of manufacture that uses a set of EDA processes 1312. When the design is finalized, the design is taped-out 1334, which is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1338 are performed to produce the finished integrated circuit 1340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 13. The processes described by be enabled by EDA products (or tools).

During system design 1314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1320, the netlist is checked for compliance with timing constraints and for correspondence with the HDL code. During design planning 1322, an overall floor plan for the integrated circuit is constructed and analyzed for timing and top-level routing.

During layout or physical implementation 1324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1326, the circuit function is verified at the layout level, which permits refinement of the layout design. During physical verification 1328, the layout design is checked to ensure that manufacturing constraints are correct, such as DRC constraints, electrical constraints, lithographic constraints, and that circuitry function matches the HDL design specification. During resolution enhancement 1330, the geometry of the layout is transformed to improve how the circuit design is manufactured.

During tape-out, data is created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1400 of FIG. 14) may be used to store the programs and data structures that are used by some or all of the EDA products described herein, and products used for development of cells for the library and for physical and logical design that use the library.

Figure 14:
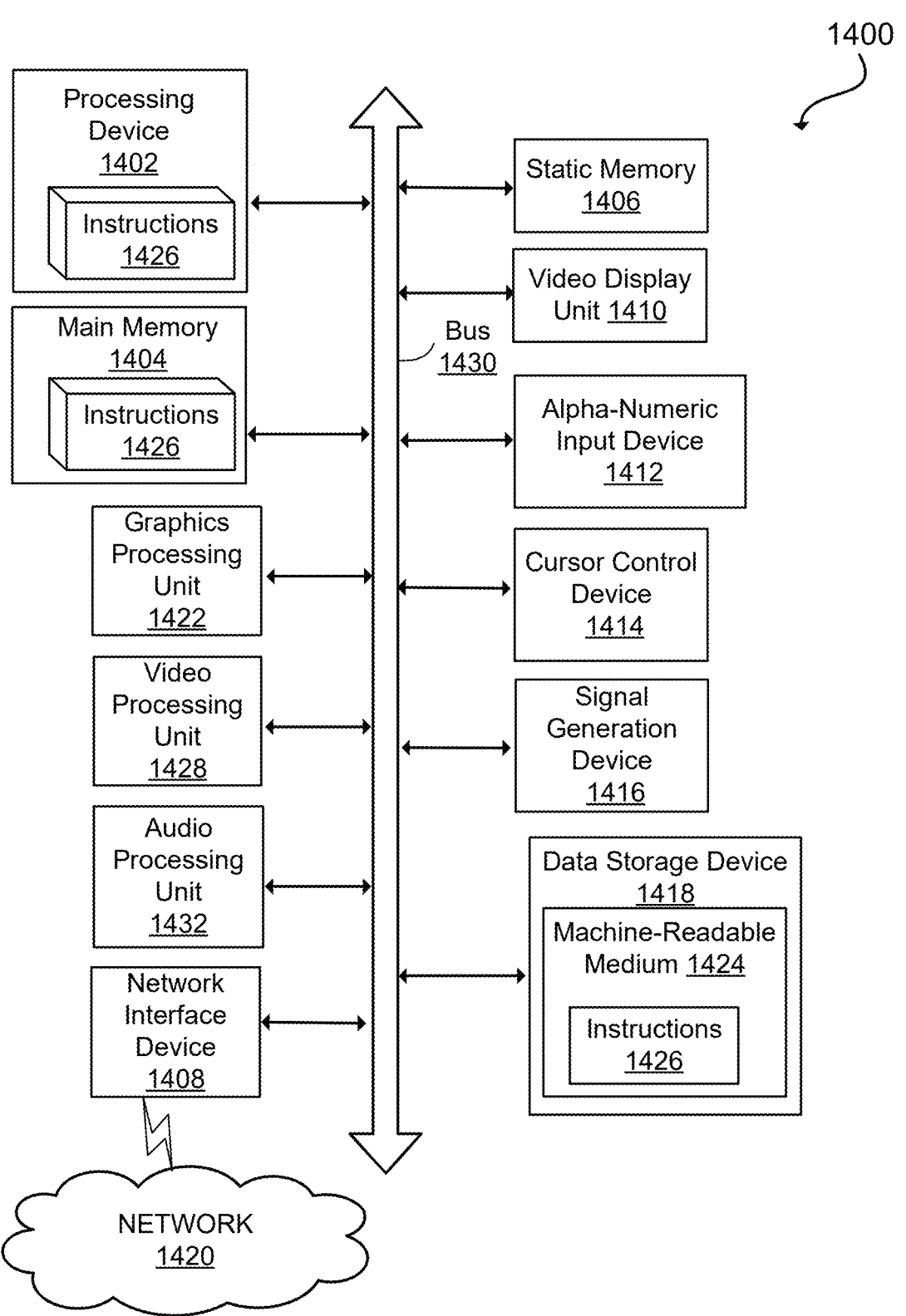
FIG. 14 depicts a diagram of an example computer system in which embodiments of the present disclosure may operate.

FIG. 14 illustrates an example machine of a computer system 1400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment. All or some of the components of the computer system 1400 may be used, for example, to drive the EDA process described in FIG. 13 to develop the design as described in FIGS. 1-6.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM), a static memory 1406 (e.g., flash memory, static random access memory (SRAM), etc.), and a data storage device 1418, which communicate with each other via a bus 1430.

Processing device 1402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. The processing device 1402 may be configured to execute instructions 1426 for performing the operations and steps described herein.

The computer system 1400 may further include a network interface device 1408 to communicate over the network 1420. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), a graphics processing unit 1422, a signal generation device 1416 (e.g., a speaker), graphics processing unit 1422, video processing unit 1428, and audio processing unit 1432.

The data storage device 1418 may include a machine-readable storage medium 1424 (also known as a non-transitory computer-readable medium) on which is stored one or more sets of instructions 1426 or software embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting machine-readable storage media.

In some implementations, the instructions 1426 include instructions to implement functionality corresponding to the present disclosure. While the machine-readable storage medium 1424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A voltage driver for supplying a supply voltage (vddio), comprising:
   a plurality of PMOS transistors connected in series and a plurality of NMOS transistors connected in series, each PMOS transistor of the plurality of PMOS transistors or NMOS transistor of the plurality of NMOS transistors having a drain-source voltage between a drain terminal and a source terminal (vdd), and a maximum of the supply voltage is N times a maximum of the drain-source voltage, where N>2;
   a pad that receives a voltage signal (vpad) for controlling gates of a subset of the plurality of NMOS transistors and a subset of the plurality of PMOS transistors;
   a first impedance divider circuit coupled to the supply voltage and the pad, the first impedance divider circuit generating a first set of voltage signals that are fractions of a voltage (padp) between the pad and vddio;
   a second impedance divider circuit coupled to the pad and ground, the second impedance divider circuit generating a second set of voltage signals that are fractions of a voltage (padn) between the pad and ground;
   a plurality of NMOS clampers that receive the first set of voltage signals to output a third set of voltage signals;
   a plurality of PMOS clampers configured to receive the second set of voltage signals to output a fourth set of voltage signals;
   a gate protection circuit coupled to outputs of the plurality of NMOS clampers and gates of a subset of the plurality of PMOS transistors respectively to protect gates of the subset of the plurality of PMOS transistors; and
   a bulk protection circuit coupled to bodies of the plurality of PMOS transistors and the first impedance divider circuit to protect the bodies of the plurality of the PMOS transistors.

2. The voltage driver of claim 1, wherein the gate protection circuit comprises a plurality of PMOS multiplexers between the plurality of NMOS clampers and gates of a subset of the plurality of PMOS transistors.

3. The voltage driver of claim 2, wherein the plurality of PMOS multiplexers includes a first PMOS multiplexer that:
   receives a first voltage signal and a second voltage signal different from the first voltage signal, and
   selectively outputs one of the first voltage signal or the second voltage signal based on a control signal that corresponds to the supply voltage (vddio), the output of the first PMOS multiplexer connected to a gate of a first PMOS transistor of the plurality of PMOS transistors.

4. The voltage driver of claim 3, wherein the plurality of PMOS multiplexers includes a second PMOS multiplexer that:
   receives a third voltage signal and an output of an NMOS clamper of the plurality of NMOS clampers, wherein each of the first, second, third signals is different from each other; and
   selectively outputs one of the third voltage signal or the output of the NMOS clamper based on a control signal that corresponds to the second voltage signal, the output of the second PMOS multiplexer connected to a gate of a second PMOS transistor of the plurality of PMOS transistors.

5. The voltage driver of claim 1, wherein the bulk protection circuit comprises a plurality of PMOS clampers between bodies of the plurality of PMOS transistors and the first impedance driver.

6. The voltage driver of claim 5, wherein the plurality of PMOS clampers includes a first PMOS clamper that receives vddio and a first voltage signal to output a second voltage signal, and the output of the first PMOS clamper is connected to a body of a first PMOS transistor of the plurality of PMOS transistors.

7. The voltage driver of claim 6, wherein the plurality of PMOS clampers further includes a second PMOS clamper that receives a second voltage signal and a third voltage signal to output a fourth voltage signal, and the output of the second PMOS clamper is connected to a body of a second PMOS transistor of the plurality of PMOS transistors.

8. The voltage driver of claim 1, wherein the gate protection circuit is also between outputs of the plurality of PMOS clampers and gates of a subset of the plurality of NMOS transistors to protect gates of the subset of the plurality of NMOS transistors, and
   wherein the bulk protection circuit is also between bodies of the plurality of NMOS transistors and the second impedance divider circuit to protect the bodies of the plurality of NMOS transistors.

9. The voltage driver of claim 8, wherein the gate protection circuit further comprises an NMOS multiplexer that receives two voltage signals and outputs one of the two voltage signals to a gate of one of the plurality of NMOS transistors.

10. The voltage driver of claim 8, wherein the bulk protection circuit further comprises a plurality of additional NMOS transistors between the bodies of a subset of the plurality of NMOS transistors and the second impedance driver.

11. The voltage driver of claim 1, wherein vpad swings between 0 and vddio.

12. The voltage driver of claim 1, wherein the plurality of PMOS transistors comprises N+1 PMOS transistors, and the plurality of NMOS transistors comprises N+1 NMOS transistors.

13. The voltage driver of claim 1, wherein the plurality of PMOS clampers comprises N–1 PMOS clampers, and the plurality of NMOS clampers comprises N–1 NMOS clampers.

14. The voltage driver of claim 1, each of the plurality of NMOS clampers comprises two interconnected NMOS transistors that receives two voltage signals and output a minimum of the two voltage signals.

15. The voltage driver of claim 1, each PMOS clamper of the plurality of PMOS clampers comprises two interconnected PMOS transistors that receives two voltage signals and output a maximum of the two voltage signals.

16. The voltage driver of claim 1, wherein the first impedance divider circuit or the second impedance divider circuit comprises N identical resistors.

17. The voltage driver of claim 1, wherein vrefn=vddio/N, and vrefp=(N–1)*vddio/N.

18. The voltage driver of claim 1, wherein the voltage signals include a signal corresponding to padp/N or multiples of padp/N.

19. A non-transitory computer-readable storage medium having instructions encoded thereon that, when executed by a processor, cause the processor to generate a design of a voltage driver for supplying a supply voltage (vddio), the voltage driver comprising:

a plurality of PMOS transistors connected in series and a plurality of NMOS transistors connected in series, each PMOS transistor of the plurality of PMOS transistors or NMOS transistor of the plurality of NMOS transistors having a drain-source voltage between a drain terminal and a source terminal (vdd), and a maximum of the supply voltage is N times a maximum of the drain-source voltage, where N>2;

a pad that receives a voltage signal (vpad) for controlling gates of a subset of the plurality of NMOS transistors and a subset of the plurality of PMOS transistors;

a first impedance divider circuit coupled to the supply voltage and the pad, the first impedance divider circuit generating a first set of voltage signals that are fractions of a voltage (padp) between the pad and vddio;

a second impedance divider circuit coupled to the pad and ground, the second impedance divider circuit generating a second set of voltage signals that are fractions of a voltage (padn) between the pad and ground;

a plurality of NMOS clampers that receive the first set of voltage signals to output a third set of voltage signals;

a plurality of PMOS clampers configured to receive the second set of voltage signals to output a fourth set of voltage signals;

a gate protection circuit coupled to outputs of the plurality of NMOS clampers and gates of a subset of the plurality of PMOS transistors respectively to protect gates of the subset of the plurality of PMOS transistors; and a bulk protection circuit coupled to bodies of the plurality of PMOS transistors and the first impedance divider circuit to protect the bodies of the plurality of the PMOS transistors.

20. A system comprising:

a processor; and a non-transitory computer-readable storage medium having instructions encoded thereon that, when executed by the processor, cause the processor to generate a design of a voltage driver for supplying a supply voltage (vddio), the voltage driver comprising:

a plurality of PMOS transistors connected in series and a plurality of NMOS transistors connected in series, each PMOS transistor of the plurality of PMOS transistors or NMOS transistor of the plurality of NMOS transistors having a drain-source voltage between a drain terminal and a source terminal (vdd), and a maximum of the supply voltage is N times a maximum of the drain-source voltage, where N>2;

a pad that receives a voltage signal (vpad) for controlling gates of a subset of the plurality of NMOS transistors and a subset of the plurality of PMOS transistors;

a first impedance divider circuit coupled to the supply voltage and the pad, the first impedance divider circuit generating a first set of voltage signals that are fractions of a voltage (padp) between the pad and vddio;

a second impedance divider circuit coupled to the pad and ground, the second impedance divider circuit generating a second set of voltage signals that are fractions of a voltage (padn) between the pad and ground;

a plurality of NMOS clampers that receive the first set of voltage signals to output a third set of voltage signals;

a plurality of PMOS clampers configured to receive the second set of voltage signals to output a fourth set of voltage signals;

a gate protection circuit coupled to outputs of the plurality of NMOS clampers and gates of a subset of the plurality of PMOS transistors respectively to protect gates of the subset of the plurality of PMOS transistors; and a bulk protection circuit coupled to bodies of the plurality of PMOS transistors and the first impedance divider circuit to protect the bodies of the plurality of the PMOS transistors.

* * * * *